(12) United States Patent
Yamazaki et al.

(10) Patent No.: US 11,410,716 B2
(45) Date of Patent: Aug. 9, 2022

(54) STORAGE DEVICE, SEMICONDUCTOR DEVICE, AND ELECTRONIC DEVICE

(71) Applicant: Semiconductor Energy Laboratory Co., Ltd., Atsugi (JP)

(72) Inventors: Shunpei Yamazaki, Setagaya (JP); Kiyoshi Kato, Atsugi (JP); Tomoaki Atsumi, Hadano (JP); Shuhei Nagatsuka, Atsugi (JP); Hitoshi Kunitake, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 44 days.

(21) Appl. No.: 16/962,309

(22) PCT Filed: Jan. 14, 2019

(86) PCT No.: PCT/IB2019/050255
§ 371 (c)(1),
(2) Date: Jul. 15, 2020

(87) PCT Pub. No.: WO2019/145814
PCT Pub. Date: Aug. 1, 2019

(65) Prior Publication Data
US 2020/0342928 A1    Oct. 29, 2020

(30) Foreign Application Priority Data

Jan. 25, 2018  (JP) ................................. 2018-010897
Feb. 20, 2018  (JP) ................................. 2018-027772
Apr. 27, 2018  (JP) ................................. 2018-086779

(51) Int. Cl.
*G11C 8/00*     (2006.01)
*G11C 11/408*   (2006.01)
*H01L 27/108*   (2006.01)

(52) U.S. Cl.
CPC ...... *G11C 11/408* (2013.01); *H01L 27/10805* (2013.01)

(58) Field of Classification Search
CPC .......................... G11C 11/408; H01L 27/10805
(Continued)

(56) References Cited

U.S. PATENT DOCUMENTS 8,455,868 B2    6/2013  Yamazaki et al.
8,508,967 B2    8/2013  Yamazaki et al.
(Continued)

FOREIGN PATENT DOCUMENTS

JP    2012-256820 A    12/2012
JP    2012-256837 A    12/2012
(Continued)

OTHER PUBLICATIONS

International Search Report (Application No. PCT/IB2019/050255) dated Apr. 2, 2019.
(Continued)

*Primary Examiner* — Viet Q Nguyen
(74) *Attorney, Agent, or Firm* — Robinson Intellectual Property Law Office; Eric J. Robinson

(57) ABSTRACT

A novel storage device and a novel semiconductor device are provided.

In the storage device, a cell array including a plurality of memory cells is stacked above a control circuit, and the cell array operates separately in a plurality of blocks. Furthermore, a plurality of electrodes are included between the control circuit and the cell array. The electrode is provided for a corresponding block to overlap with the block, and a potential of the electrode can be changed for each block. The electrode has a function of aback gate of a transistor included in the memory cell, and a potential of the electrode is changed for each block, whereby the electrical characteristics of the transistor included in the memory cell can be changed. Moreover, the electrode can reduce noise caused in the control circuit.

8 Claims, 22 Drawing Sheets

(58) Field of Classification Search
USPC .................................................. 365/230.01
See application file for complete search history.

(56) References Cited

U.S. PATENT DOCUMENTS

| | | | |
|---|---|---|---|
| 9,601,178 | B2 | 3/2017 | Yamazaki et al. |
| 9,935,633 | B2 * | 4/2018 | Tamura ............... H01L 27/1225 |
| 10,204,925 | B2 | 2/2019 | Yoneda |
| 10,236,875 | B2 * | 3/2019 | Kato ....................... H01L 29/26 |
| 10,388,364 | B2 * | 8/2019 | Ishizu ................. G11C 11/4099 |
| 10,497,419 | B2 | 12/2019 | Yamazaki et al. |
| 10,504,420 | B2 * | 12/2019 | Katayama ......... H01L 29/66969 |
| 10,936,410 | B2 * | 3/2021 | Tsutsui ................. G11C 11/405 |
| 10,998,447 | B2 * | 5/2021 | Onuki ................. H01L 29/7869 |
| 2012/0188814 | A1 | 7/2012 | Yamazaki et al. |
| 2016/0099258 | A1 | 4/2016 | Yoneda |
| 2017/0302271 | A1 | 10/2017 | Kato et al. |

FOREIGN PATENT DOCUMENTS

| | | |
|---|---|---|
| JP | 2016-076285 A | 5/2016 |
| JP | 2016-086170 A | 5/2016 |
| JP | 2017-201569 A | 11/2017 |
| KR | 2012-0099344 A | 9/2012 |
| KR | 2017-0068511 A | 6/2017 |
| TW | 201234365 | 8/2012 |
| TW | 201810267 | 3/2018 |
| WO | WO-2016/055894 | 4/2016 |

OTHER PUBLICATIONS

Written Opinion (Application No. PCT/IB2019/050255) dated Apr. 2, 2019.

Onuki.T et al., "DRAM with Storage Capacitance of 3.9 fF using CAAC-OS Transistor with L of 60 nm and having More Than 1-h Retention Characteristics", SSDM 2014 (Extended Abstracts of the 2014 International Conference on Solid State Devices and Materials), Sep. 8, 2014, pp. 430-431.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner

FIG. 11A
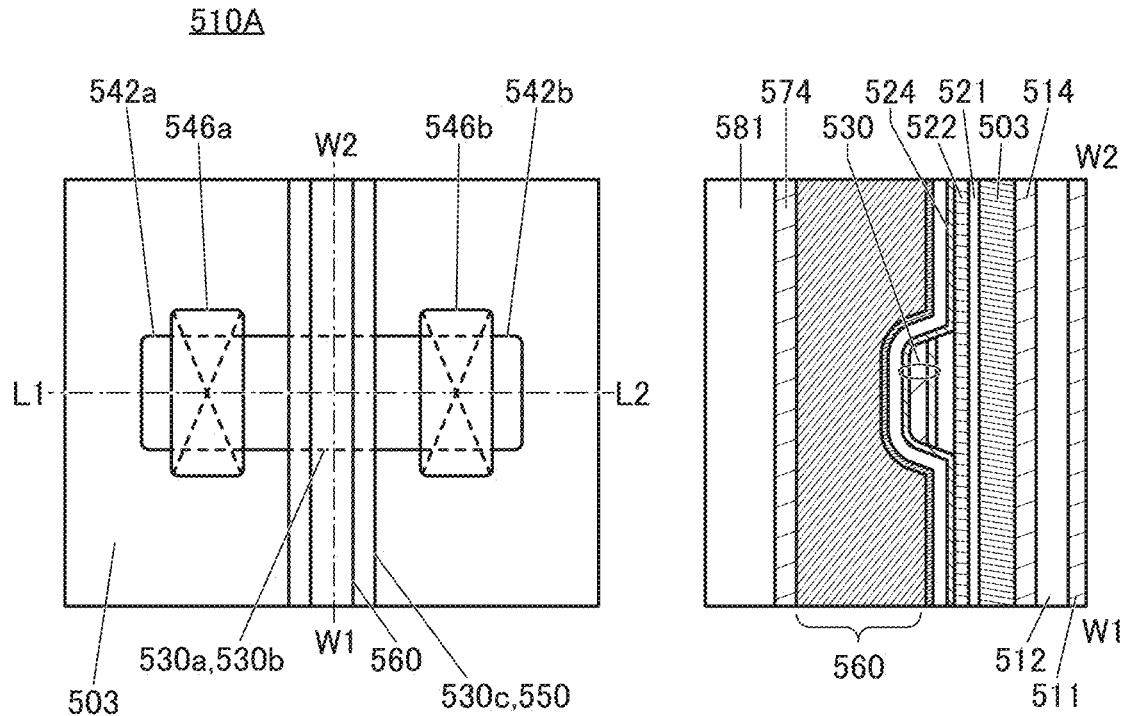
FIG. 11C
FIG. 11B
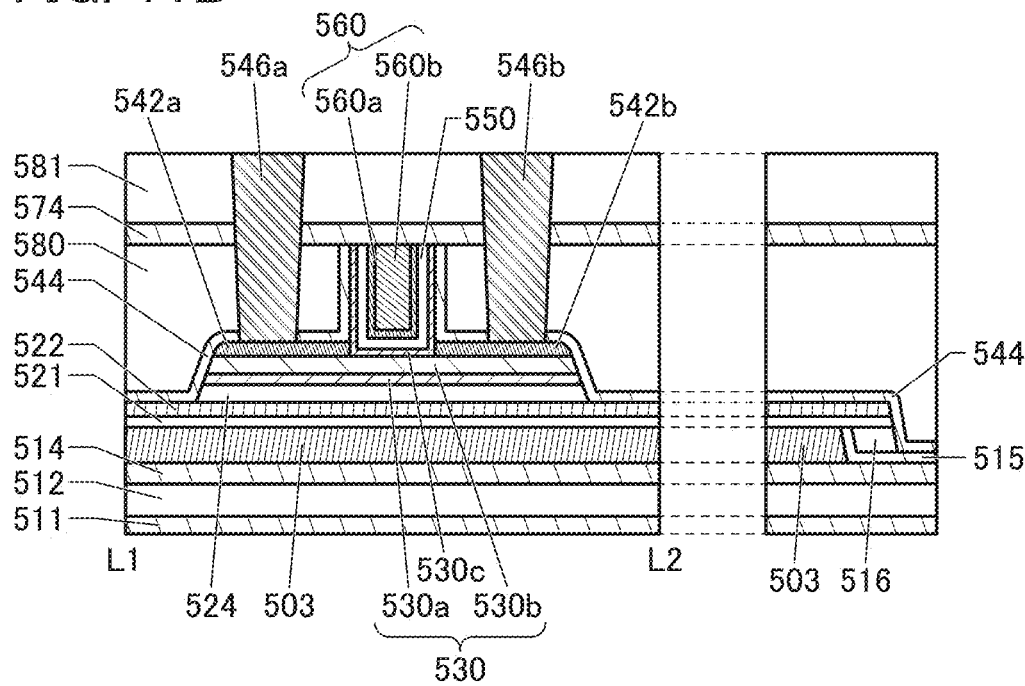

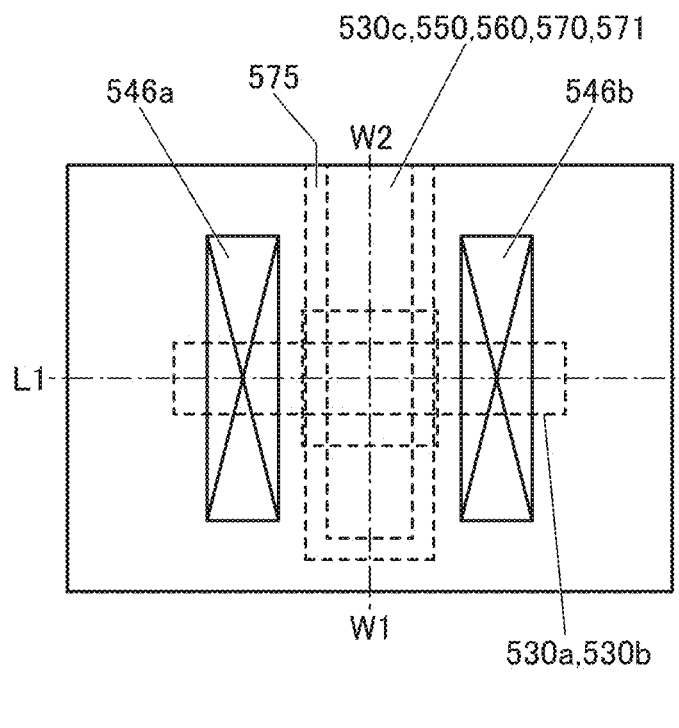
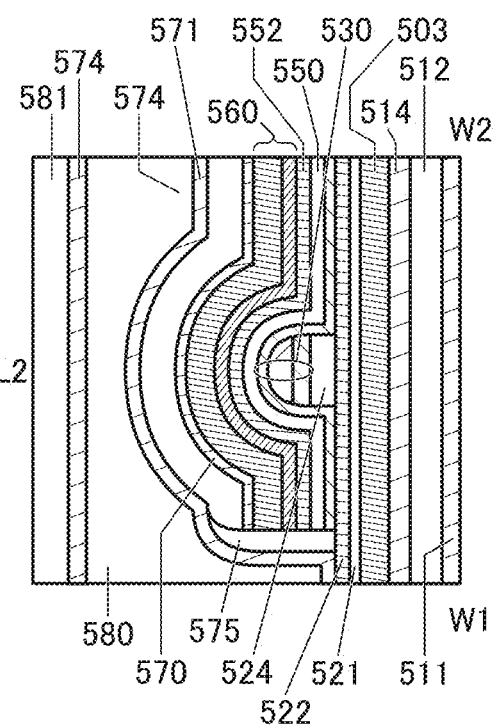
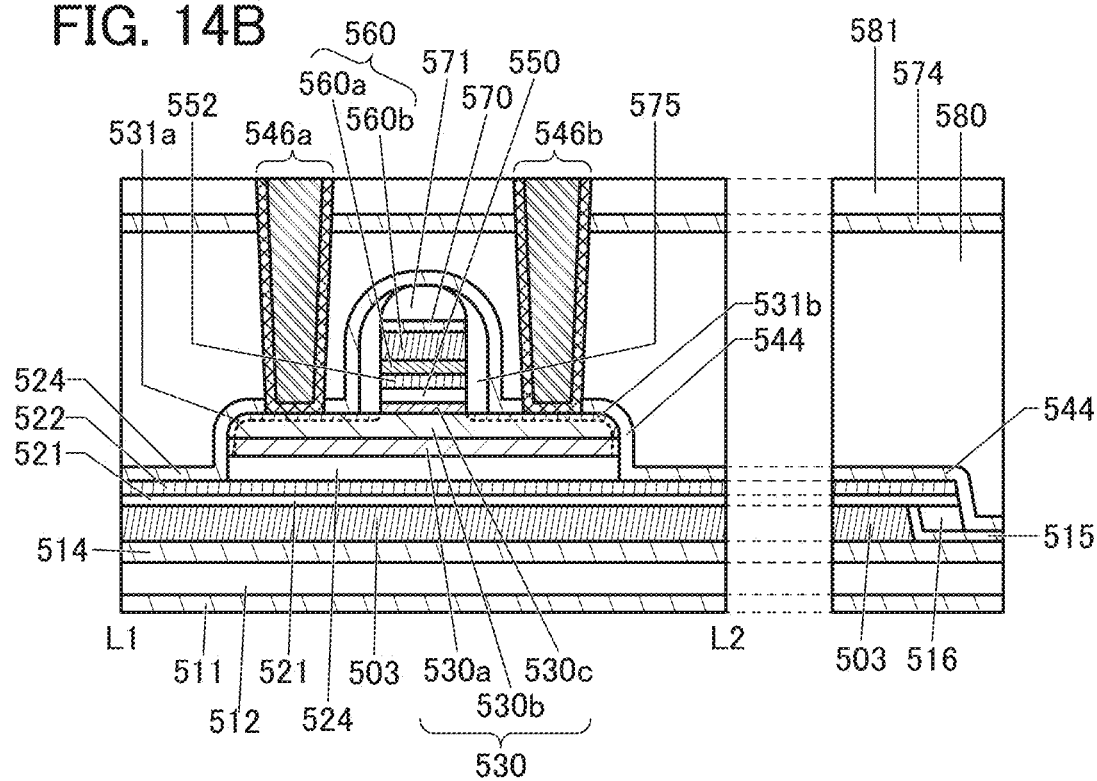

FIG. 16A
5500
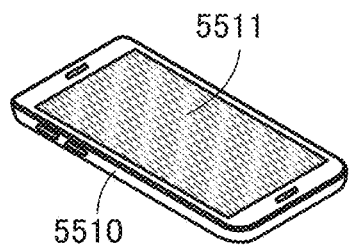
FIG. 16B
5300
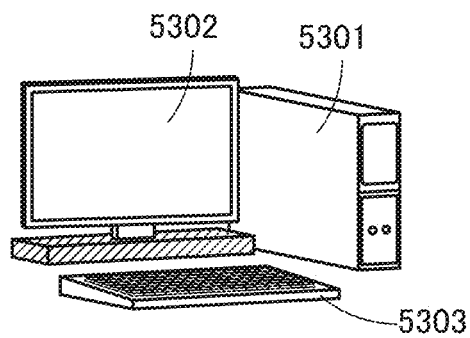
FIG. 16C
5800
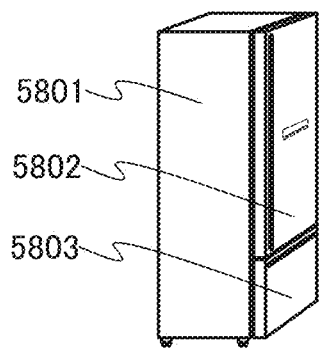
FIG. 16D
5200
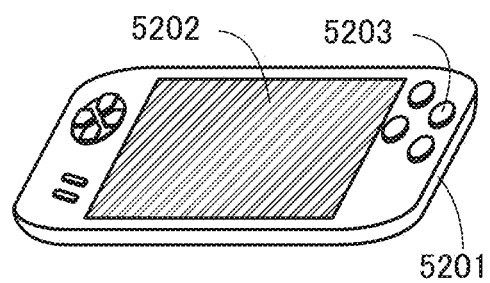
FIG. 16E1
5700
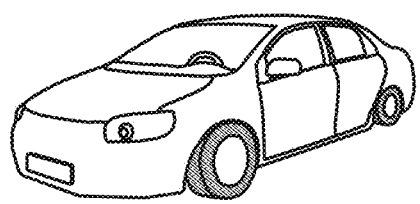
FIG. 16E2
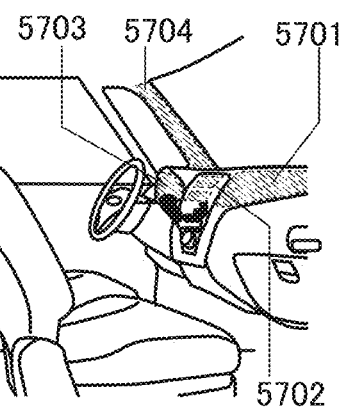

STORAGE DEVICE, SEMICONDUCTOR DEVICE, AND ELECTRONIC DEVICE

TECHNICAL FIELD

One embodiment of the present invention relates to a storage device. In particular, one embodiment of the present invention relates to a storage device that can function by utilizing semiconductor characteristics.

One embodiment of the present invention relates to a semiconductor device. Note that in this specification and the like, a semiconductor device refers to all devices that can function by utilizing semiconductor characteristics. For example, an integrated circuit, a chip including an integrated circuit, an electronic component including a packaged chip, and an electronic device including an integrated circuit are examples of a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

BACKGROUND ART

A DRAM (Dynamic Random Access Memory) is widely used as a storage device (also referred to as a memory) incorporated in various kinds of electronic devices. Patent Document 1 and Non-Patent Document 1 disclose examples in which a transistor using an oxide semiconductor (also referred to as an oxide semiconductor transistor or an OS transistor) is used in a memory cell of a DRAM.

Since the leakage current of an oxide semiconductor transistor in an off state (off-state current) is extremely low, the use of an oxide semiconductor transistor in a memory cell of a DRAM enables stored data to be retained for a long time. In other words, a DRAM with a low refresh frequency and low power consumption can be manufactured.

Furthermore, the oxide semiconductor transistor is a thin film transistor and can be stacked. For example, when a peripheral circuit is formed using a Si transistor formed on a single crystal silicon substrate and a memory cell is formed using an oxide semiconductor transistor formed thereabove, a chip area can be reduced.

In this specification and the like, a DRAM in which an oxide semiconductor transistor is used for a memory cell is referred to as an "oxide semiconductor DRAM" or a "DOSRAM (registered trademark, Dynamic Oxide Semiconductor Random Access Memory)".

An oxide semiconductor has attracted attention in recent years also as a semiconductor which can be applied to a transistor. Not only single-component metal oxides, such as indium oxide and zinc oxide, but also multi-component metal oxides are known as oxide semiconductors, for example. Among the multi-component metal oxides, in particular, an In—Ga—Zn oxide (also referred to as IGZO) has been actively studied.

From the studies on IGZO, in an oxide semiconductor, a CAAC (c-axis aligned crystalline) structure and an nc (nanocrystalline) structure, which are not single crystal nor amorphous, have been found (see Non-Patent Document 2 to Non-Patent Document 4).

In Non-Patent Document 2 and Non-Patent Document 3, a technique for forming a transistor using an oxide semiconductor having a CAAC structure is disclosed. Moreover, Non-Patent Document 5 and Non-Patent Document 6 show that a fine crystal is included even in an oxide semiconductor which has lower crystallinity than the CAAC structure and the nc structure.

Non-Patent Document 7 reports the extremely low off-state current of a transistor using an oxide semiconductor, and Non-Patent Document 8 and Non-Patent Document 9 report an LSI and a display which utilize such a property of extremely low off-state current.

REFERENCE

Patent Document

[Patent Document 1] Japanese Published Patent Application No. 2012-256820

Non-Patent Document

[Non-Patent Document 1] T. Onuki et al., "DRAM with Storage Capacitance of 3.9 fF using CAAC-OS Transistor with L of 60 nm and having More Than 1-h Retention Characteristics", Ext. Abstr. SSDM, 2014, pp. 430-431.
[Non-Patent Document 2] S. Yamazaki et al., "SID Symposium Digest of Technical Papers", 2012, volume 43, issue 1, pp. 183-186.
[Non-Patent Document 3] S. Yamazaki et al., "Japanese Journal of Applied Physics", 2014, volume 53, Number 4S, pp. 04ED18-1-04ED18-10.
[Non-Patent Document 4] S. Ito et al., "The Proceedings of AM-FPD'13 Digest of Technical Papers", 2013, pp. 151-154.
[Non-Patent Document 5] S. Yamazaki et al., "ECS Journal of Solid State Science and Technology", 2014, volume 3, issue 9, pp. Q3012-Q3022.
[Non-Patent Document 6] S. Yamazaki, "ECS Transactions", 2014, volume 64, issue 10, pp. 155-164.
[Non-Patent Document 7] K. Kato et al., "Japanese Journal of Applied Physics", 2012, volume 51, pp. 021201-1-021201-7.
[Non-Patent Document 8] S. Matsuda et al., "2015 Symposium on VLSI Technology Digest of Technical Papers", 2015, pp. T216-T217.
[Non-Patent Document 9] S. Amano et al., "SID Symposium Digest of Technical Papers", 2010, volume 41, issue 1, pp. 626-629.

SUMMARY OF THE INVENTION

Problems to be Solved by the Invention

As described above, when a peripheral circuit is formed using a Si transistor formed on a single crystal silicon substrate and a memory cell is formed using an oxide semiconductor transistor formed thereabove, the memory cell is influenced by noise due to operation of the peripheral circuit in some cases.

That is, in the case where a first circuit is formed using a transistor formed on a semiconductor substrate such as a single crystal silicon substrate and a second circuit is formed using an oxide semiconductor transistor formed thereabove, there is a possibility that the second circuit is influenced by noise due to operation of the first circuit or the first circuit is influenced by noise due to operation of the second circuit.

An object of one embodiment of the present invention is to reduce the degree of influence of noise due to operation of a peripheral circuit on a memory cell in a storage device in which the memory cell using an oxide semiconductor transistor is stacked above the peripheral circuit formed on a single crystal silicon substrate.

Another object of one embodiment of the present invention is to reduce the degree of influence of noise due to operation of a first circuit on a second circuit or the degree of influence of noise due to operation of the second circuit on the first circuit in a semiconductor device in which the second circuit using an oxide semiconductor transistor is stacked above the first circuit formed on a semiconductor substrate.

Another object of one embodiment of the present invention is to provide an electronic device including the above storage device or the above semiconductor device.

Note that one embodiment of the present invention does not necessarily achieve all the above objects and only needs to achieve at least one of the objects. The descriptions of the above objects do not preclude the existence of other objects. Objects other than these will be apparent from the description of the specification, the claims, the drawings, and the like, and objects other than these can be derived from the description of the specification, the claims, the drawings, and the like.

Means for Solving the Problems

One embodiment of the present invention is a semiconductor device including first to N-th (N is an integer of two or more) electrodes and first and second circuits. The first circuit and the second circuit are electrically connected to each other through a plurality of wirings, and the second circuit includes first to N-th regions. Each of the first to N-th regions includes a first transistor, and among the first to N-th regions, the K-th (K is an integer greater than or equal to 1 and less than or equal to N) region includes a region overlapping with the first circuit with the K-th electrode therebetween. The K-th electrode functions as a back gate of the first transistor included in the K-th region.

In the above embodiment, first to M-th (M is an integer of 2 or more) potentials are applied to the corresponding first to N-th electrodes, and the first to M-th potentials differ from each other.

In the above embodiment, the first transistor includes a metal oxide in a channel formation region.

In the above embodiment, the first transistor overlaps with a layer containing silicon and nitrogen, and the resistivity of the layer is higher than or equal to $1 \times 10^{10}$ Ωcm and lower than or equal to $1 \times 10^{15}$ Ωcm.

In the above embodiment, the first circuit includes a second transistor, and the second transistor includes silicon in a channel formation region.

Another embodiment of the present invention is a storage device including first to N-th (N is an integer of two or more) electrodes, a control circuit, and a cell array. The control circuit has a function of controlling the cell array, and the cell array includes first to N-th regions. Each of the first to N-th regions includes a plurality of memory cells, each of the memory cells includes a first transistor and a capacitor, and among the first to N-th regions, the K-th (K is an integer greater than or equal to 1 and less than or equal to N) region includes a region overlapping with a first circuit with the K-th electrode therebetween. The K-th electrode functions as a back gate of the first transistor included in the memory cell in the K-th region.

In the above embodiment, first to M-th (M is an integer of 2 or more) potentials are applied to the corresponding first to N-th electrodes, and the first to M-th potentials differ from each other.

In the above embodiment, the first transistor includes a metal oxide in a channel formation region.

In the above embodiment, the first transistor overlaps with a layer containing silicon and nitrogen, and the resistivity of the layer is higher than or equal to $1 \times 10^{10}$ Ωcm and lower than or equal to $1 \times 10^{15}$ Ωcm.

In the above embodiment, the first circuit includes a second transistor, and the second transistor includes silicon in a channel formation region.

Another embodiment of the present invention is a storage device including first and second electrodes, a control circuit, and a cell array. The control circuit has a function of controlling the cell array, and the cell array includes first and second regions. Each of the first and second regions includes a plurality of memory cells, each of the memory cells includes a first transistor and a capacitor, the first region includes a region overlapping with the control circuit with the first electrode therebetween, and the second region includes a region overlapping with the control circuit with the second electrode therebetween. The first electrode functions as a back gate of the first transistor included in the memory cell in the first region, and the second electrode functions as a back gate of the first transistor included in the memory cell in the second region.

In the above embodiment, a potential applied to the first electrode is different from a potential applied to the second electrode.

In the above embodiment, the first transistor includes a metal oxide in a channel formation region.

In the above embodiment, the first transistor overlaps with a layer containing silicon and nitrogen, and the resistivity of the layer is higher than or equal to $1 \times 10^{10}$ Ωcm and lower than or equal to $1 \times 10^{15}$ Ωcm.

In the above embodiment, the control circuit includes a second transistor, and the second transistor includes silicon in a channel formation region.

Effect of the Invention

According to one embodiment of the present invention, in a storage device in which a memory cell using an oxide semiconductor transistor is stacked above the peripheral circuit formed on a single crystal silicon substrate, the degree of influence of noise due to operation of a peripheral circuit on the memory cell can be reduced.

According to one embodiment of the present invention, in a semiconductor device in which a second circuit using an oxide semiconductor transistor is stacked above the first circuit formed on a semiconductor substrate, the degree of influence of noise due to operation of a first circuit on the second circuit or the degree of influence of noise due to operation of the second circuit on the first circuit can be reduced.

According to one embodiment of the present invention, an electronic device including the above storage device or the above semiconductor device can be provided.

Note that the descriptions of the effects do not disturb the existence of other effects. One embodiment of the present invention does not necessarily have all the effects. Effects other than these will be apparent from and can be derived from the descriptions of the specification, the claims, the drawings, and the like.

BRIEF DESCRIPTION OF THE DRAWINGS

FIG. 11(A) A top view illustrating a structure example of a transistor, (B), (C) cross-sectional views illustrating the structure example of the transistor.

FIG. 14(A) A top view illustrating a structure example of a transistor, and (B), (C) cross-sectional views illustrating the structure example of the transistor.

FIG. 16(A), (B), (C), (D), (E1), (E2) Diagrams illustrating structure examples of electronic devices.

MODE FOR CARRYING OUT THE INVENTION

Figure 1:
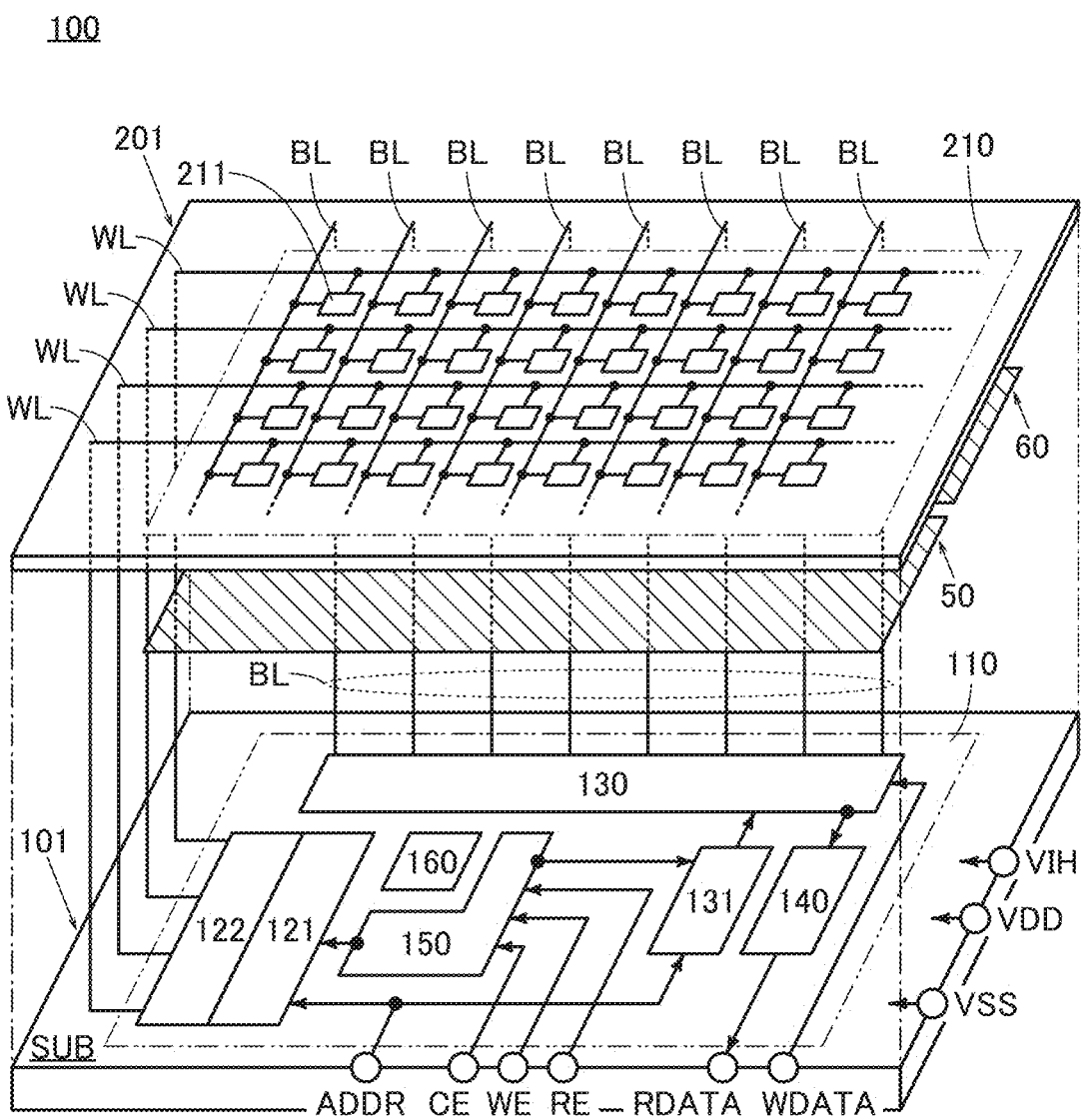
FIG. 1 A schematic perspective view illustrating a structure example of a memory.

Hereinafter, embodiments are described with reference to drawings. However, the embodiments can be implemented with many different modes, and it will be readily appreciated by those skilled in the art that modes and details thereof can be changed in various ways without departing from the spirit and scope thereof. Thus, the present invention should not be interpreted as being limited to the following description of the embodiments.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to separate actual components completely according to their functions, and it is possible for one component to relate to a plurality of functions.

In the drawings and the like, the size, the layer thickness, the region, or the like is exaggerated for clarity in some cases. Therefore, they are not limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

Moreover, in this specification and the like, the term "film" and the term "layer" can be interchanged with each other. For example, the term "conductive layer" can be changed into the term "conductive film" in some cases. Also, for example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

In this specification and the like, "voltage" often refers to a potential difference between a given potential and a reference potential (e.g., a ground potential). Thus, a voltage and a potential difference can be interchanged with each other.

In this specification and the like, a transistor is an element having at least three terminals including a gate, a drain, and a source. A channel formation region is included between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be interchanged with each other when a transistor of opposite polarity is employed or when the direction of current is changed in circuit operation, for example. Thus, the terms of source and drain are interchangeable for use in this specification and the like.

Unless otherwise specified, an off-state current in this specification and the like refers to a drain current of a transistor in an off state (also referred to as a non-conducting state or a cutoff state). Unless otherwise specified, the off state of an n-channel transistor refers to a state where voltage Vgs of a gate with respect to a source is lower than a threshold voltage Vth, and the off state of a p-channel transistor refers to a state where the voltage Vgs of a gate with respect to a source is higher than the threshold voltage Vth. That is, the off-state current of an n-channel transistor sometimes refers to a drain current at the time when the voltage Vgs of a gate with respect to a source is lower than the threshold voltage Vth.

In the above description of the off-state current, the drain may be replaced with the source. That is, the off-state current sometimes refers to a source current when the transistor is in an off state. In addition, leakage current sometimes expresses the same meaning as off-state current. In this specification and the like, the off-state current sometimes refers to a current that flows between a source and a drain when a transistor is in the off state.

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is called an oxide semiconductor in some cases. That is, in the case where a metal oxide has at least one of an amplifying function, a rectifying function, and a switching function, the metal oxide can be called a metal oxide semiconductor. In other words, a transistor containing a metal oxide in a channel formation region can be referred to as an "oxide semiconductor transistor" or an "OS transistor". Similarly, the "transistor using an oxide semiconductor" described above is also a transistor containing a metal oxide in a channel formation region.

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, structure examples of a storage device of one embodiment of the present invention will be described. The storage device of one embodiment of the present invention is a storage device that can function by utilizing semiconductor characteristics, and is also called a memory. In addition, the storage device of one embodiment of the present invention has a structure in which a memory cell using an oxide semiconductor transistor (hereinafter referred to as an OS transistor) is stacked above a peripheral circuit formed on a semiconductor substrate.

Structure Example 1 of Memory

FIG. 1 is a schematic perspective view illustrating a structure example of a memory 100 of one embodiment of the present invention.

The memory 100 includes a layer 101 and a layer 201 and has a structure in which the layer 201 is stacked above the layer 101. In each of the layer 101 and the layer 201, a circuit that can function by utilizing semiconductor characteristics is provided; a peripheral circuit 110 is provided in the layer 101, and a memory cell array 210 (denoted by "Memory Cell Array" in FIG. 2) is provided in the layer 201. The layer 201 includes a conductive layer 50 and a conductive layer 60 below the memory cell array 210. The conductive layer 50 and the conductive layer 60 will be described later. Note that in the drawings described in this embodiment, the flow of main signals is indicated by an arrow or a line, and a power supply line and the like are omitted.

The peripheral circuit 110 includes a row decoder 121, a word line driver circuit 122, a bit line driver circuit 130, a column decoder 131, an output circuit 140, a control logic circuit 150, and a VBG control circuit 160. The peripheral circuit 110 has a function of a control circuit for the memory cell array 210.

The peripheral circuit 110 is formed with transistors formed on a semiconductor substrate SUB. The semiconductor substrate SUB is not particularly limited as long as it can include a channel formation region of a transistor. For example, a single crystal silicon substrate, a single crystal germanium substrate, a compound semiconductor substrate (such as a SiC substrate or a GaN substrate), an SOI (Silicon on Insulator) substrate, or the like can be used.

As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing, or an SOI substrate formed by using a Smart-Cut method in which a semiconductor substrate is cleaved by utilizing growth of a minute void, which is formed by implantation of a hydrogen ion, by thermal treatment; an ELTRAN method (a registered trademark: Epitaxial Layer Transfer). A transistor formed using a single crystal substrate contains a single crystal semiconductor in a channel formation region.

In this embodiment, a case in which a single crystal silicon substrate is used as the semiconductor substrate SUB will be described. A transistor formed on a single crystal silicon substrate is referred to as a Si transistor. The peripheral circuit 110 formed using Si transistors can operate at high speed.

Figure 2:
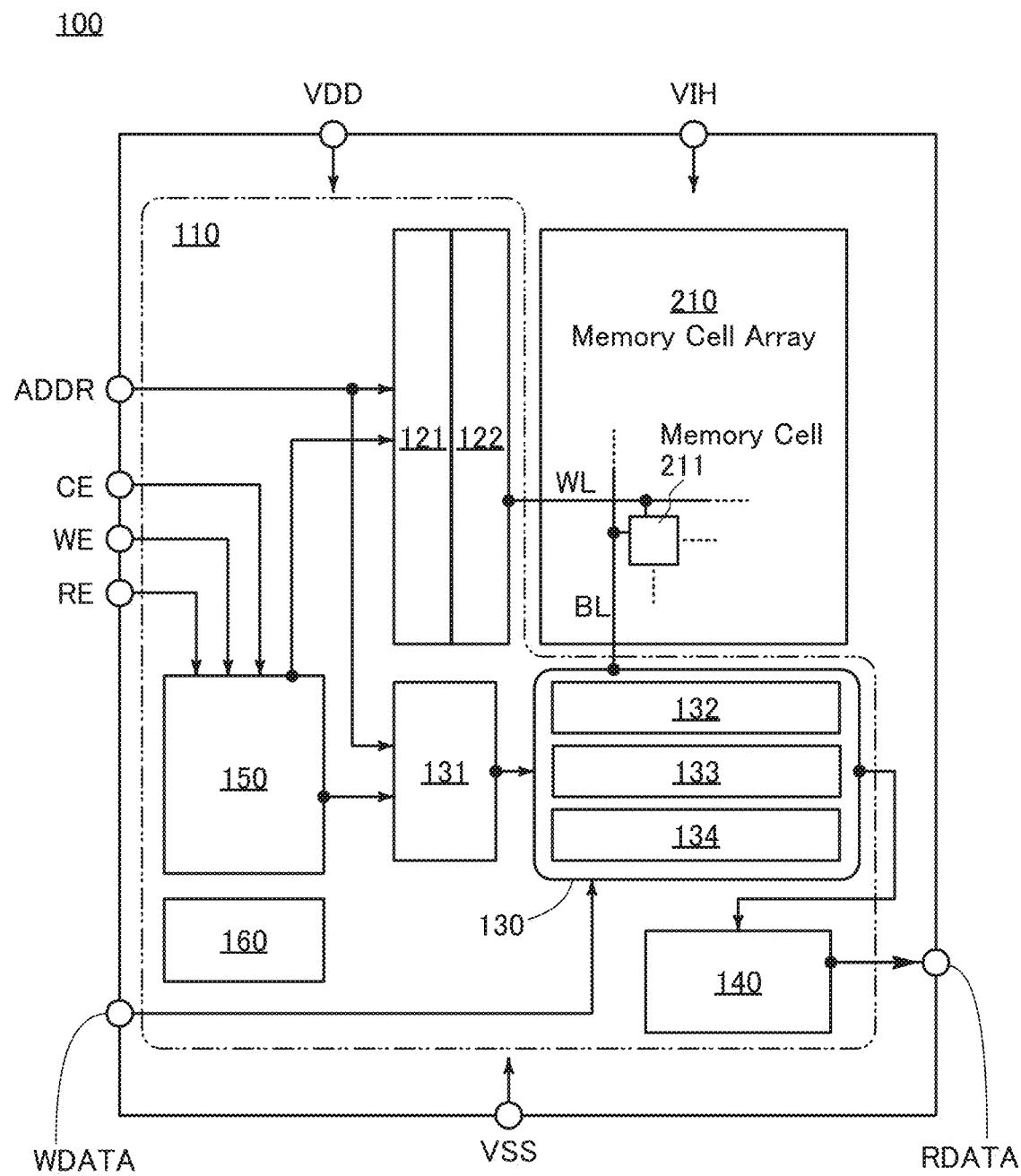
FIG. 2 A block diagram illustrating a structure example of a memory.

The memory cell array 210 includes a plurality of memory cells 211 (denoted by "Memory Cell" in FIG. 2).

The memory cell array 210 is formed using OS transistors. An oxide semiconductor has a bandgap of 2.5 eV or larger, preferably 3.0 eV or larger; thus, an OS transistor has a low leakage current due to thermal excitation and also has an extremely low off-state current. Note that off-state current refers to current that flows between a source and a drain when a transistor is off.

A metal oxide used in a channel formation region of the transistor is preferably an oxide semiconductor containing at least one of indium (In) and zinc (Zn). Typical examples of such an oxide semiconductor include an In-M-Zn oxide (an element M is Al, Ga, Y, or Sn, for example). Reducing both impurities serving as electron donors, such as moisture or hydrogen, and oxygen vacancies can make an oxide semiconductor i-type (intrinsic) or substantially i-type. Such an oxide semiconductor can be referred to as a highly purified oxide semiconductor. Note that the details of an OS transistor will be described in Embodiment 3.

The memory cell 211 has a function of storing data. The memory cell 211 may have a function of storing binary (high level and low level) data or may have a function of storing multilevel data of four or more levels. The memory cell 211 may have a function of storing analog data. An OS transistor has an extremely low off-state current and thus is suitably used as a transistor included in the memory cell 211.

An off-state current per micrometer of channel width of an OS transistor can be, for example, lower than or equal to 100 zA/μm, lower than or equal to 10 zA/μm, lower than or equal to 1 zA/μm, or lower than or equal to 10 yA/μm. The use of an OS transistor in the memory cell 211 enables data stored in the memory cell 211 to be retained for a long time.

With the use of an OS transistor for the memory cell 211, the refresh frequency of the memory cell 211 can be low. Alternatively, refresh operation of the memory cell 211 can be unnecessary. The low refresh rate of the memory cell 211 can reduce the power consumption of the memory 100. Alternatively, eliminating the need for the refresh operation of the memory cell 211 can reduce circuits needed for the refresh operation.

Since off-state current of the OS transistor is not easily increased even at high temperatures, data stored in the memory cell 211 is less likely to be lost even at high temperatures caused by heat generation by the peripheral circuit 110. The use of an OS transistor can increase the reliability of the memory 100.

Furthermore, the OS transistor is a thin film transistor and can be stacked above the semiconductor substrate SUB.

Each of the memory cells 211 included in the memory cell array 210 is connected to a wiring WL and a wiring BL. The memory cell 211 is selected in accordance with a potential supplied to the wiring WL, and a potential corresponding to data to be written to the memory cell 211 is supplied to the wiring BL; thus, data is written to the memory cell 211. The memory cell 211 is selected in accordance with a potential supplied to the wiring WL and data stored in the memory cell 211 changes the potential of the wiring BL, whereby the data is read from the memory cell 211.

In other words, the wiring WL has a function of a word line of the memory cell 211, and the wiring BL has a function of a bit line of the memory cell 211. A potential supplied through the wiring BL and a potential read through the wiring BL are referred to as data signals in this specification and the like.

As a layout method of the memory cells 211 in the memory cell array 210, a folded-type layout, an open-type layout, or the like can be used. In the case where a folded-type layout is used, noise generated in a reading potential output to the wiring BL can be reduced owing to a change in the potential of the wiring WL. In the case where an open-type layout is used, the density of the memory cells 211 can be higher than that in the case of a folded-type layout, and thus the area of the memory cell array 210 can be reduced. FIG. 1 illustrates a structure example in the case where an open-type layout is used.

Structure Example 2 of Memory

FIG. 2 is a block diagram illustrating a structure example of the memory 100.

The bit line driver circuit 130 is connected to the wiring BL and includes a precharge circuit 132, a sense amplifier 133, and a writing circuit 134. The precharge circuit 132 has a function of precharging the wiring BL. The sense amplifier 133 has a function of amplifying a data signal read from the wiring BL, and the writing circuit 134 has a function of writing a data signal to the wiring BL. The amplified data signal is output to the outside of the memory 100 as a digital data signal RDATA via the output circuit 140.

The word line driver circuit 122 is connected to the wiring WL and has a function of driving the wiring WL. The word line driver circuit 122 selects the memory cell 211 which is subjected to data writing or reading by driving the wiring WL.

As power from the outside, a low power supply potential VSS, a high power supply potential VDD for the peripheral circuit 110, and a high power supply potential VIH for the memory cell array 210 are supplied to the memory 100. Here, the high power supply potential VDD is a potential higher than the low power supply potential VSS. For example, the high power supply potential VIH can be a potential higher than the high power supply potential VDD or the same potential as the high power supply potential VDD.

Control signals (CE, WE, and RE), an address signal ADDR, and a data signal WDATA are input to the memory 100 from the outside. The address signal ADDR is input to the row decoder 121 and the column decoder 131, and WDATA is input to the bit line driver circuit 130.

The control logic circuit 150 processes the control signals (CE, WE, and RE) input from the outside, and generates control signals for the row decoder 121 and the column decoder 131. CE denotes a chip enable signal, WE denotes a write enable signal, and RE denotes a read enable signal. Signals processed by the control logic circuit 150 are not limited to the above, and other control signals may be input as necessary.

In the memory 100, each circuit, each signal, and each potential described above can be appropriately selected as needed. Alternatively, another circuit, another signal, or another potential may be added.

Memory Cell Array

Figure 3A:
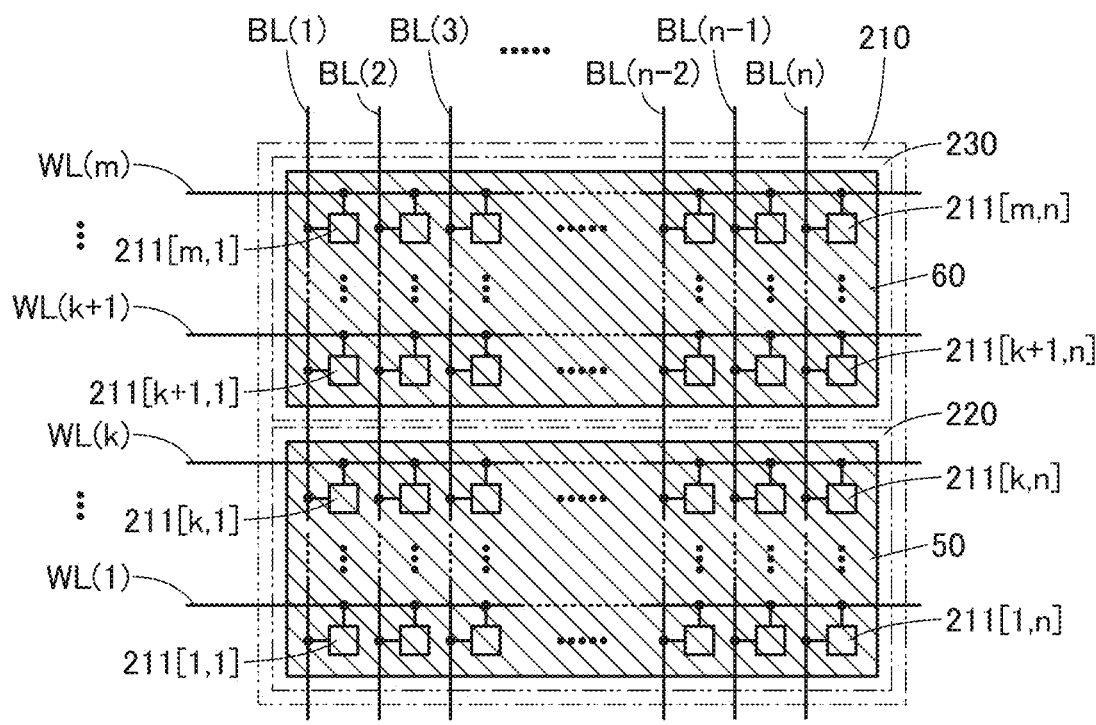
FIG. 3(A) A top view illustrating a structure example of a memory cell array, and (B) a circuit diagram illustrating a structure example of a memory cell.

FIG. 3(A) is a top view illustrating a structure example of the memory cell array 210. The memory cell array 210 will be described in detail with reference to FIG. 3(A).

The memory cell array 210 is divided into a memory cell array 220 positioned above the conductive layer 50 and a memory cell array 230 positioned above the conductive layer 60.

The memory cell array 220 includes k rows (k is an integer greater than or equal to 1) of n memory cells 211 (n is an integer greater than or equal to 1) in one row, and the memory cells 211 are arranged in a matrix. In FIG. 3(A), [1,1], [1,n], [k,1], and [k,n] denote addresses of the memory cells 211, and the memory cell array 220 includes k×n memory cells 211.

The memory cell array 230 includes (m−k) rows (m is an integer greater than or equal to k+1) of n memory cells 211 (n is an integer greater than or equal to 1) in one row, and the memory cells 211 are arranged in a matrix. In FIG. 3(A), [k+1,1], [k+1,n],[m,1], and [m,n] denote addresses of the memory cells 211, and the memory cell array 230 includes (m−k)×n memory cells 211.

The memory cell array 220 and the memory cell array 230 include n wirings BL (BL(1) to BL(n)). The memory cell array 220 includes k wirings WL (WL(1) to WL(k)), and the memory cell array 230 includes m−k wirings WL (WL(k+1) to WL(m)).

The memory cells 211 are connected to the corresponding wirings BL and the corresponding wirings WL, and as illustrated in FIG. 1 and FIG. 2, the wirings BL are connected to the bit line driver circuit 130 and the wirings WL are connected to the word line driver circuit 122. Thus, the memory cells 211 are electrically connected to the bit line driver circuit 130 through the wirings BL and electrically connected to the word line driver circuit 122 through the wirings WL.

Although not illustrated, the conductive layer 50 and the conductive layer 60 are electrically connected to the VBG control circuit 160 (see FIG. 1 and FIG. 2). A potential generated by the VBG control circuit 160 can be applied to the conductive layer 50 and the conductive layer 60.

<Memory Cell 1>

Figure 3B:
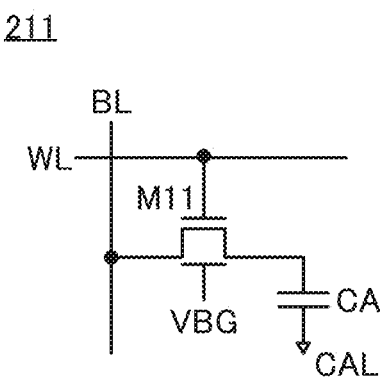

FIG. 3(B) is a circuit diagram illustrating a structure example of the memory cell 211.

The memory cell 211 includes a transistor M11 and a capacitor CA. Note that the transistor M11 includes a front gate (simply referred to as a gate in some cases) and a back gate.

One of a source and a drain of the transistor M11 is electrically connected to a first terminal of the capacitor CA, and the other of the source and the drain of the transistor M1 is connected to the wiring BL. The gate of the transistor M11 is connected to the wiring WL, and the back gate of the transistor M11 is connected to a wiring VBG. A second terminal of the capacitor CA is connected to a wiring CAL.

The wiring BL has a function of a bit line of the memory cell 211, the wiring WL has a function of a word line of the memory cell 211, and the wiring CAL functions as a wiring for applying a predetermined potential to the second terminal of the capacitor CA. The wiring VBG functions as a wiring for applying a potential to the back gate of the transistor M11.

Here, the wiring VBG is connected to the conductive layer 50 or the conductive layer 60, and a potential applied to the conductive layer 50 or the conductive layer 60 can be applied to the back gate of the transistor M11. Alternatively, the conductive layer 50 or the conductive layer 60 can be used as the back gate of the transistor M11. That is, a potential generated by the VBG control circuit 160 can be applied to the back gate of the transistor M1 through the conductive layer 50 or the conductive layer 60.

By applying a potential generated by the VBG control circuit 160 to the back gate of the transistor M11, the threshold voltage of the transistor M11 can be increased or decreased.

The transistor M11 has a function of a switch for controlling conduction or non-conduction between the first terminal of the capacitor CA and the wiring BL. To perform data writing or reading, a high-level potential is applied to the wiring WL so that the first terminal of the capacitor CA and the wiring BL are brought into a conduction state. The memory cell 211 is a memory that retains data by accumulating charges in the capacitor CA, and writing or reading of the data retained in the memory cell 211 is performed through the wiring BL and the transistor M11.

The transistor M11 is a transistor containing a metal oxide in a channel formation region (OS transistor). For example, a metal oxide containing any one of indium, an element M (the element M is aluminum, gallium, yttrium, or tin), and zinc can be used for a channel formation region of the transistor M11. In particular, a metal oxide formed of indium, gallium, and zinc is preferable.

Since the OS transistor has an extremely low off-state current, data written to the memory cell 211 can be retained for a long time. Thus, the refresh frequency of the memory cell 211 can be low, and the memory 100 can be a memory with low power consumption. Alternatively, refresh operation of the memory cell 211 can be unnecessary. Alternatively, the memory 100 can be a highly reliable memory in which data is less likely to be lost even at high temperature.

When the OS transistor is used as the transistor M11, the above-described DOSRAM can be formed.

<Memory Cell 2>

Note that the structure of the memory cell 211 is not limited to the above. As another structure example of the memory cell 211, a memory cell 212 illustrated in FIG. 4(A) will be described.

The memory cell 212 includes a transistor M12, a transistor M13, and a capacitor CB. The transistor M12 includes a front gate and a back gate.

One of a source and a drain of the transistor M12 is electrically connected to a first terminal of the capacitor CB and a gate of the transistor M13, and the other of the source and the drain of the transistor M12 is connected to a wiring WBL. The gate of the transistor M12 is connected to the wiring WL, and the back gate of the transistor M12 is connected to the wiring VBG. A second terminal of the capacitor CB is connected to the wiring CAL. One of a source and a drain of the transistor M13 is connected to a wiring SL, and the other of the source and the drain of the transistor M13 is connected to a wiring RBL.

The wiring WBL has a function of a write bit line, the wiring RBL has a function of a read bit line, and the wiring WL has a function of a word line. The wiring CAL functions as a wiring for applying a predetermined potential to the second terminal of the capacitor CB. The wiring VBG functions as a wiring for applying a potential to the back gate of the transistor M12.

Here, the wiring VBG is connected to the conductive layer 50 or the conductive layer 60, and a potential applied to the conductive layer 50 or the conductive layer 60 can be applied to the back gate of the transistor M12. Alternatively, the conductive layer 50 or the conductive layer 60 can be used as the back gate of the transistor M12. That is, a potential generated by the VBG control circuit 160 can be applied to the back gate of the transistor M12 through the conductive layer 50 or the conductive layer 60.

By applying a potential generated by the VBG control circuit 160 to the back gate of the transistor M12, the threshold voltage of the transistor M12 can be increased or decreased.

The transistor M12 has a function of a switch for controlling conduction or non-conduction between the first terminal of the capacitor CB and the wiring WBL.

To perform data writing, a high-level potential is applied to the wiring WL so that the first terminal of the capacitor CB and the wiring WBL are brought into a conduction state. Specifically, a potential corresponding to data to be written is applied to the wiring WBL when the transistor M12 is in a conduction state, whereby the potential is written to the first terminal of the capacitor CB and the gate of the transistor M13. After that, a low-level potential is applied to the wiring WL so that the transistor M12 is brought into a non-conduction state, whereby the potential of the first terminal of the capacitor CB and the potential of the gate of the transistor M13 are retained.

Data reading is performed by application of a predetermined potential to the wiring SL. Current that flows between the source and the drain of the transistor M13 is determined by the potential of the gate of the transistor M13 and the potential of the one of the source and the drain of the transistor M13 (the wiring SL), and the potential of the other of the source and the drain of the transistor M13 is determined by the current. Thus, the potential retained at the first terminal of the capacitor CB (or the gate of the transistor M13) can be read by reading the potential of the wiring RBL connected to the other of the source and the drain of the transistor M13.

Note that the transistor M12 is a transistor containing a metal oxide in a channel formation region (OS transistor), like the transistor M11. There is no particular limitation on the transistor M13. For example, an OS transistor or a Si transistor may be used as the transistor M13.

The memory cell 212 is a gain-cell memory cell with two transistors and one capacitor. A gain-cell memory cell can operate as a memory by amplifying accumulated charges by the closest transistor even when the capacitance of the capacitor is small.

When an OS transistor with an extremely low off-state current is used as the transistor M12, the memory cell 212 can retain accumulated charges even in a period during which power supply is stopped and thus can have a property of a non-volatile memory. In this specification and the like, a memory including a gain-cell memory cell using an OS transistor is called a "NOSRAM (Nonvolatile Oxide Semiconductor Random Access Memory)". Since data rewriting in a NOSRAM is performed by charging and discharging of a capacitor, there is theoretically no limitation on rewrite cycles.

Figure 4A:
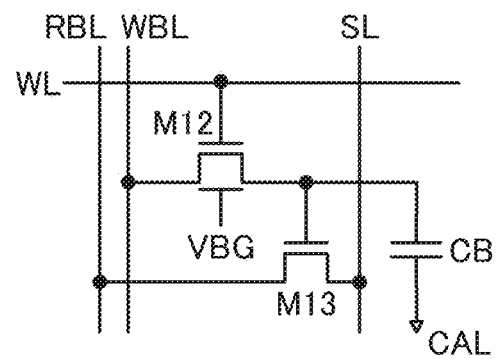
FIG. 4(A), (B), (C) Circuit diagrams each illustrating a structure example of a memory cell.
Figure 4B:
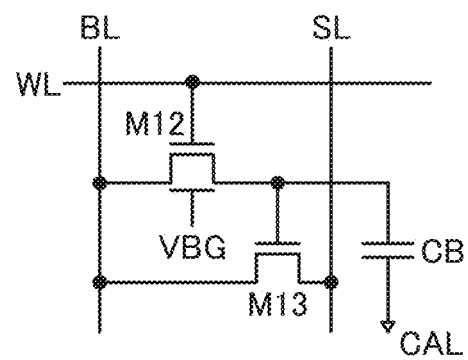

The memory cell 212 may have a structure in which the wiring WBL and the wiring RBL are combined into one wiring BL. FIG. 4(B) illustrates a structure example in which the wiring WBL and the wiring RBL are combined into one wiring BL.

In a memory cell 213 illustrated in FIG. 4(B), the other of the source and the drain of the transistor M12 and the other of the source and the drain of the transistor M13 are connected to the wiring BL. In other words, the memory cell 213 has a structure in which one wiring BL operates as a write bit line and a read bit line. In that case, the wiring SL is preferably brought into an electrically floating state (floating) when data is written.

<Memory Cell 3>

The memory cell 212 may be a gain-cell memory cell with three transistors and one capacitor. As a structure example in the case where the memory cell 212 is a gain-cell memory cell with three transistors and one capacitor, a memory cell 214 illustrated in FIG. 4(C) will be described.

The memory cell 214 includes a transistor M14 to a transistor M16 and a capacitor CC. The transistor M14 includes a front gate and a back gate.

One of a source and a drain of the transistor M14 is electrically connected to a first terminal of the capacitor CC and a gate of the transistor M15, and the other of the source and the drain of the transistor M14 is connected to the wiring BL. The gate of the transistor M14 is connected to the wiring WL, and the back gate of the transistor M14 is connected to the wiring VBG. A second terminal of the capacitor CC is electrically connected to the wiring CAL and one of a source and a drain of the transistor M15, and the other of the source and the drain of the transistor M15 is electrically connected to one of a source and a drain of the transistor M16. The other of the source and the drain of the transistor M16 is connected to the wiring BL, and a gate of the transistor M16 is connected to a wiring RWL.

The wiring BL has a function of a bit line, the wiring WL has a function of a write word line, and the wiring RWL has a function of a read word line. The wiring CAL functions as a wiring for applying a predetermined potential to the second terminal of the capacitor CC (for example, a low-level potential is applied as a predetermined potential). The wiring VBG functions as a wiring for applying a potential to the back gate of the transistor M14.

Here, the wiring VBG is connected to the conductive layer 50 or the conductive layer 60, and a potential applied to the conductive layer 50 or the conductive layer 60 can be applied to the back gate of the transistor M14. Alternatively, the conductive layer 50 or the conductive layer 60 can be used as the back gate of the transistor M14. That is, a potential generated by the VBG control circuit 160 can be applied to the back gate of the transistor M14 through the conductive layer 50 or the conductive layer 60.

By applying a potential generated by the VBG control circuit 160 to the back gate of the transistor M14, the threshold voltage of the transistor M14 can be increased or decreased.

The transistor M14 has a function of a switch for controlling conduction or non-conduction between the first terminal of the capacitor CC and the wiring BL, and the transistor M16 has a function of a switch for controlling conduction or non-conduction between the other of the source and the drain of the transistor M15 and the wiring BL.

To perform data writing, a high-level potential is applied to the wiring WL so that the first terminal of the capacitor CC and the wiring BL are brought into a conduction state. Specifically, a potential corresponding to data to be written is applied to the wiring BL when the transistor M14 is in a conduction state, whereby the potential is written to the first terminal of the capacitor CC and the gate of the transistor M15. After that, a low-level potential is applied to the wiring WL so that the transistor M14 is brought into a non-conduction state, whereby the potential of the first terminal of the capacitor CC and the potential of the gate of the transistor M15 are retained.

To perform data reading, a predetermined potential is applied (precharged) to the wiring BL, and then the wiring BL is brought into an electrically floating state (floating) and a high-level potential is applied to the wiring RWL. When a high-level potential is applied to the wiring RWL, the transistor M16 is brought into a conduction state and the other of the source and the drain of the transistor M15 and the wiring BL are in an electrical connection state. In that case, a voltage corresponding to a potential difference between the wiring BL and the wiring CAL is applied between the source and the drain of the transistor M15, and current that flows between the source and the drain of the transistor M15 is determined by the gate potential of the transistor M15 and the voltage applied between the source and the drain.

Here, the potential of the wiring BL changes depending on the current that flows between the source and the drain of the transistor M15; thus, a potential retained at the first terminal of the capacitor CC (or the gate of the transistor M15) can be read by reading the potential of the wiring BL.

Note that the transistor M14 is a transistor containing a metal oxide in a channel formation region (OS transistor), like the transistor M11. There is no particular limitation on the transistor M15 and the transistor M16. For example, OS transistors or Si transistors may be used as the transistor M15 and the transistor M16.

Figure 4C:
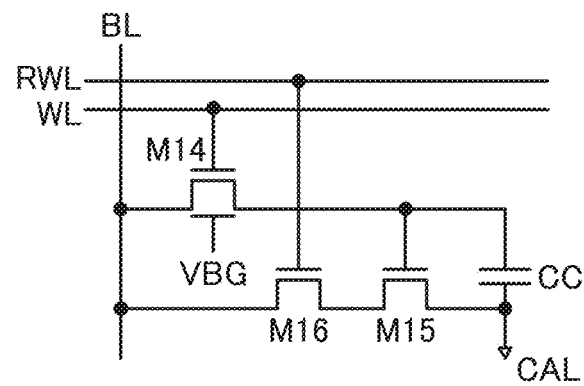

Although different structure examples of the memory cell 211 are described with reference to FIG. 4(A) to FIG. 4(C), the structure of the memory cell 211 is not limited thereto and the structure of the circuit can be changed as appropriate.

<Conductive Layer>

As described above, the layer 201 includes the conductive layer 50 below the memory cell array 220 and the conductive layer 60 below the memory cell array 230. In the k×n memory cells 211 included in the memory cell array 220, the potential of the conductive layer 50 is applied to the back gate of the transistor M11, and in the (m−k)×n memory cells 211 included in the memory cell array 230, the potential of the conductive layer 60 is applied to the back gate of the transistor M11.

Since the threshold voltage of the OS transistor can be increased or decreased by a potential applied to the back gate, the transistor M11 of the memory cell 211 included in the memory cell array 220 and the transistor M11 of the memory cell 211 included in the memory cell array 230 can have different threshold voltages.

Specifically, the threshold voltage shifts in the negative direction when a high potential is applied to the back gate of the OS transistor, and the threshold voltage shifts in the positive direction when a low potential is applied to the back gate of the OS transistor. When the threshold voltage shifts in the negative direction, the on-state current of the transistor can be increased, and when the threshold voltage shifts in the positive direction, the off-state current of the transistor can be reduced. A potential to be applied to the back gate of the OS transistor is generated by the VBG control circuit 160.

In other words, in the memory cell array where data writing or reading is performed, the potential of the conductive layer positioned therebelow is increased, whereby the on-state current of the transistor can be increased, and data writing speed or data reading speed can be increased. Furthermore, in the memory cell array where data retention is performed, the potential of the conductive layer positioned therebelow is decreased, whereby the off-state current of the transistor can be reduced, and data retention time can be made longer.

The layer 201 includes the conductive layer 50 below the memory cell array 220 and the conductive layer 60 below the memory cell array 230, whereby the degree of influence of noise due to the operation of the peripheral circuit 110 on the memory cell array 220 and the memory cell array 230 can be reduced.

That is, the conductive layer 50 and the conductive layer 60 can reduce the degree of influence of noise due to the operation of the peripheral circuit 110 on the memory cell array 220 and the memory cell array 230, increase the operating speed of the memory cell array where data writing or data reading is performed, and lengthen data retention time of the memory cell array where data retention is performed.

Figure 5A:
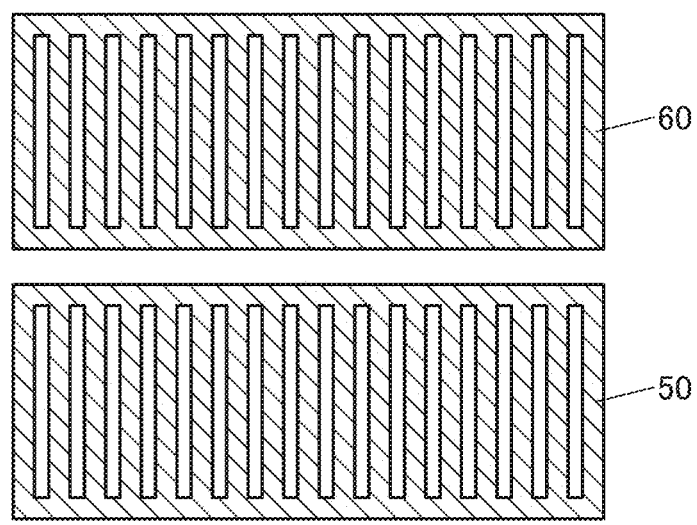
FIG. 5(A), (B) Top views each illustrating an example of patterns of conductive layers.
Figure 5B:
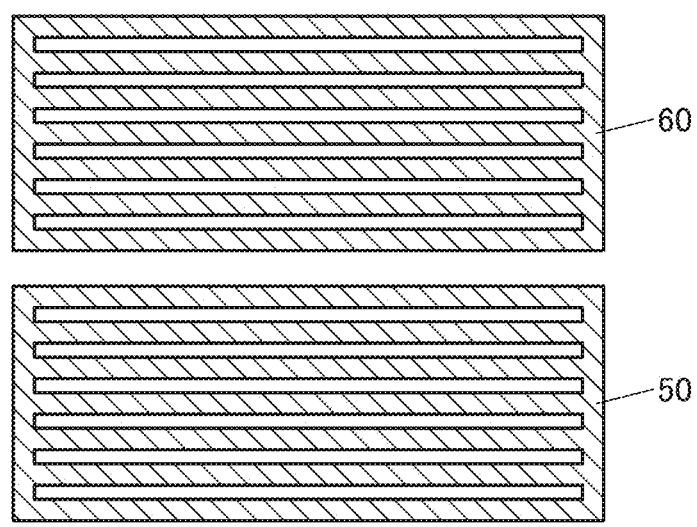
Figure 6A:
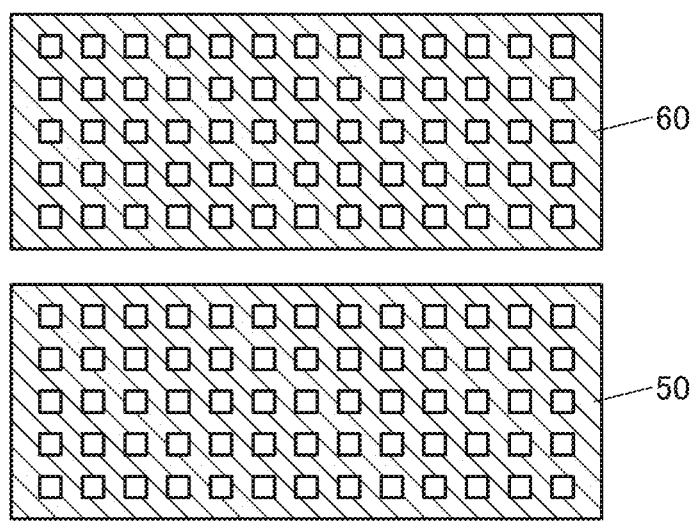
FIG. 6(A), (B) Top views each illustrating an example of patterns of a conductive layers.
Figure 6B:
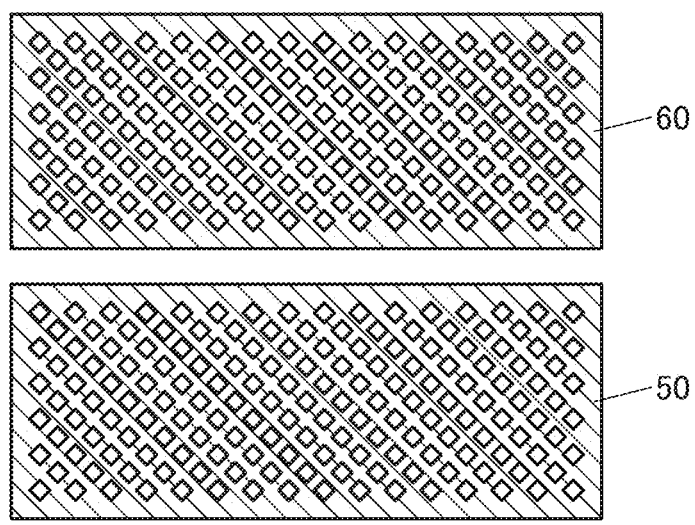

The conductive layer 50 and the conductive layer 60 may have a shape such as a striped pattern, a matrix pattern, or a mesh pattern. Alternatively, part of the conductive layer 50 and the conductive layer 60 may have an opening. FIG. 5(A) and FIG. 5(B) each illustrate an example (a top view) of the case where the conductive layer 50 and the conductive layer 60 have a striped pattern, FIG. 6(A) illustrates an example (a top view) of the case where the conductive layer 50 and the conductive layer 60 have a matrix pattern, and FIG. 6(B) illustrates an example (a top view) of the case where the conductive layer 50 and the conductive layer 60 have a mesh pattern.

Figure 7:
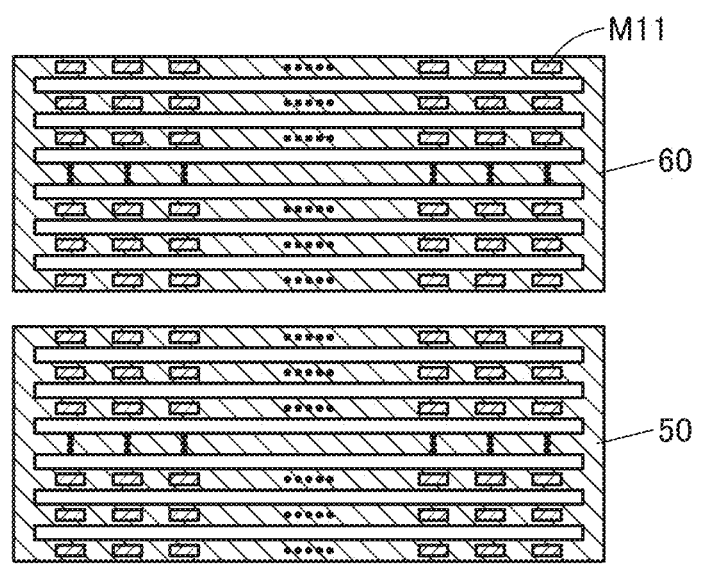
FIG. 7 A top view illustrating the positional relation between conductive layers and transistors.

FIG. 7 illustrates a positional relation between the transistors M11 and each of the conductive layer 50 and the conductive layer 60 in the case where the conductive layer 50 and the conductive layer 60 have a striped pattern illustrated in FIG. 5(B). As illustrated in FIG. 7, the transistors M11 are provided over the conductive layer 50 and the conductive layer 60. When the conductive layer 50 and the conductive layer 60 have a shape such as a striped pattern or openings, for example, the parasitic capacitance of the memory cell array 210 can be reduced.

Figure 8:
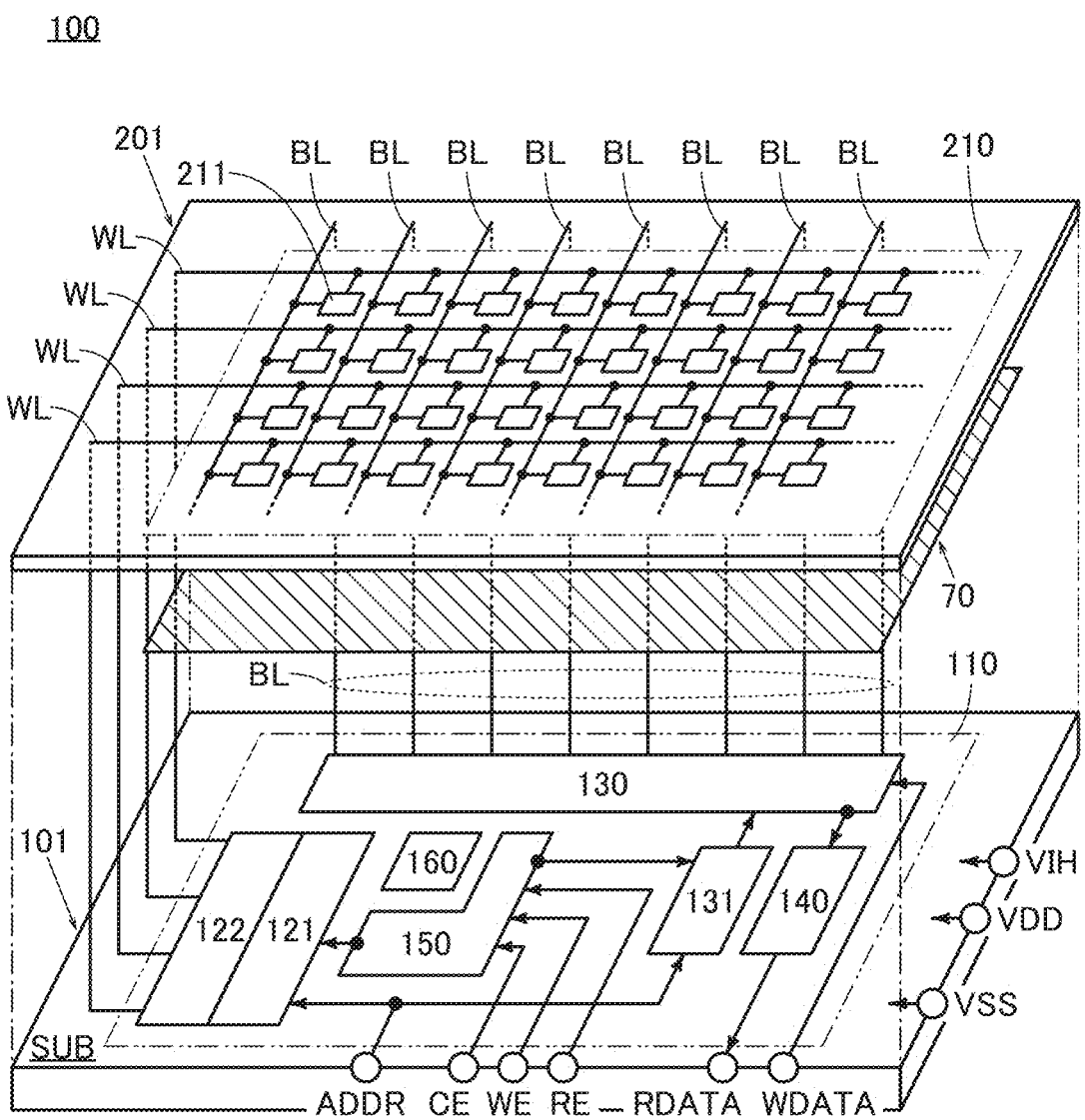
FIG. 8 A schematic perspective view illustrating a structure example of a memory.

Although an example in which the layer 201 includes the conductive layer 50 and the conductive layer 60 is described in this embodiment, the number of conductive layers included in the layer 201 may be one or three or more. FIG. 8 is a schematic perspective view in the case where the number of conductive layers included in the layer 201 is one. In the memory 100 illustrated in FIG. 8, the layer 201 includes a conductive layer 70 below the memory cell array 210.

Although an example in which the conductive layer 50 is included below the memory cells 211 connected to the wiring WL(1) to the wiring WL(k) and the conductive layer 60 is included below the memory cells 211 connected to the wiring WL(k+1) to the wiring WL(m) is described with reference to FIG. 1 and FIG. 3 in this embodiment, the conductive layer 50 may be included below the memory cells 211 connected to the wiring BL(1) to the wiring BL(l) (l is an integer greater than or equal to 1 and less than or equal to n−1), and the conductive layer 60 may be included below the memory cells 211 connected to the wiring BL(l+1) to the wiring BL(n).

As described above, the memory 100 has a structure in which the layer 201 is stacked above the layer 101, the layer 201 includes the conductive layer 50 and the conductive layer 60 below the memory cell array 210, and the conductive layer 50 and the conductive layer 60 reduce noise due to the operation of the peripheral circuit 110 provided in the layer 101. Moreover, the conductive layer 50 and the conductive layer 60 apply potentials to the back gates of the OS transistors, whereby part of the memory cell array 210 can be a memory cell array with high operating speed or a memory cell array with a long data retention time.

Note that this embodiment can be implemented in combination with the other embodiments and example described in this specification as appropriate.

Embodiment 2

Structure examples of the Si transistor that is applicable to the peripheral circuit 110 and the OS transistor that is applicable to the memory cell 211 described in the above embodiment will be described in this embodiment. Note that the Si transistor and the OS transistor are collectively referred to as a semiconductor device in this embodiment.

<Structure Example of Semiconductor Device>

Figure 9:
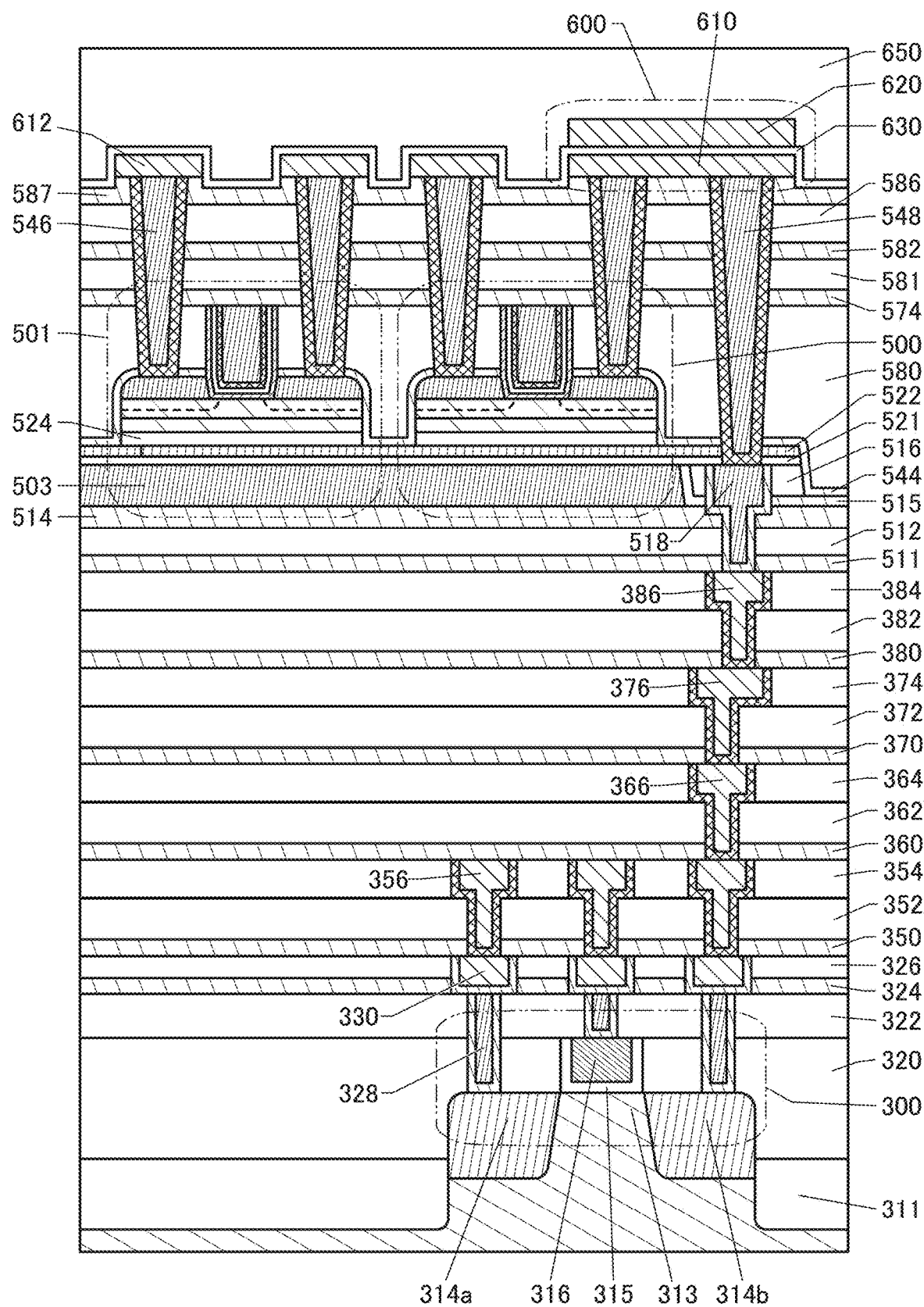
FIG. 9 A cross-sectional view illustrating a structure example of a semiconductor device.
Figure 10A:
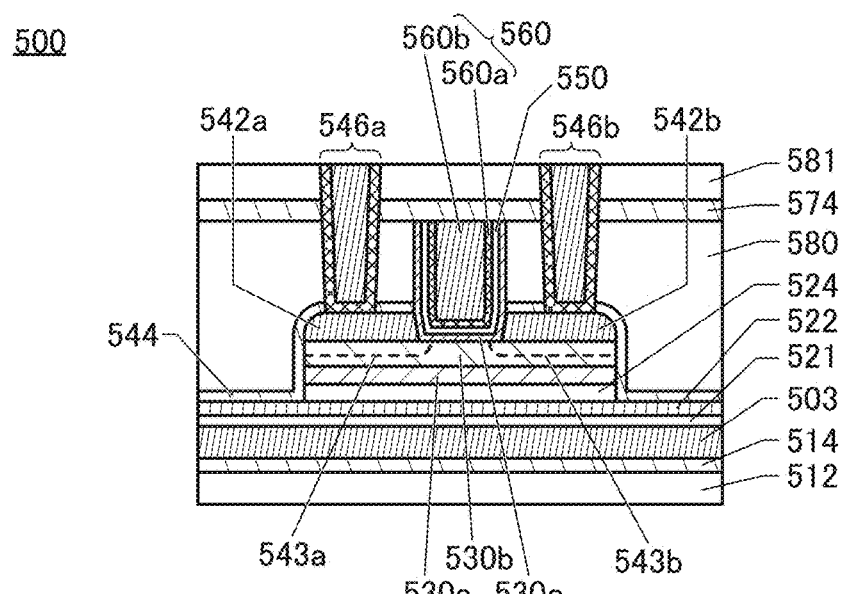
FIG. 10(A), (B), (C) Cross-sectional views illustrating structure examples of transistors.
Figure 10B:
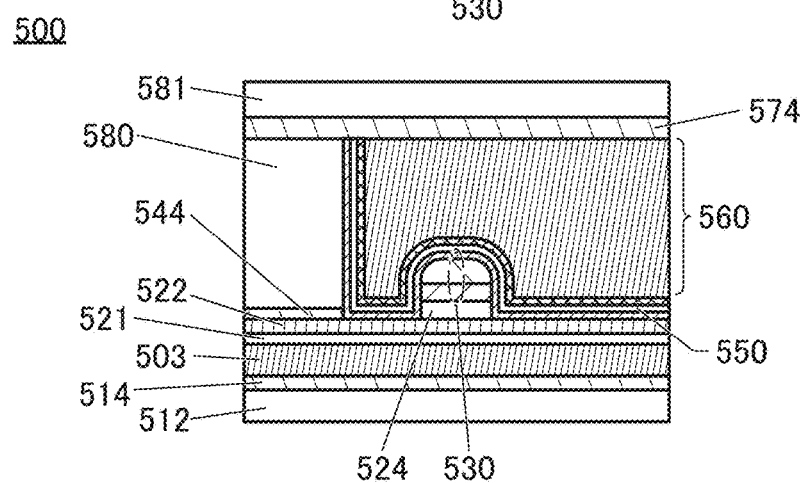
Figure 10C:
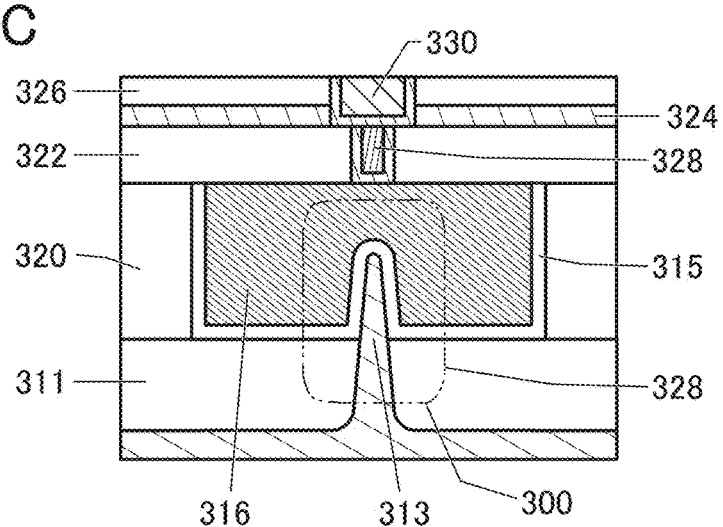

A semiconductor device illustrated in FIG. 9 includes a transistor 300, a transistor 500, a transistor 501, and a capacitor 600. FIG. 10(A) is a cross-sectional view of the transistor 500 in the channel length direction, FIG. 10(B) is a cross-sectional view of the transistor 500 in the channel width direction, and FIG. 10(C) is a cross-sectional view of the transistor 300 in the channel width direction.

The transistor 500 is a transistor containing a metal oxide in a channel formation region (OS transistor). Since the off-state current of the transistor 500 is low, a semiconductor device using such a transistor can retain stored data for a long time. In other words, the frequency of refresh operation is low or refresh operation is not required; thus, the power consumption of the semiconductor device can be reduced. The transistor 501 has a structure similar to that of the transistor 500.

The transistor 500 and the transistor 501 are provided above the transistor 300, and the capacitor 600 is provided above the transistor 500 and the transistor 501.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

As illustrated in FIG. 10(C), in the transistor 300, a top surface and a side surface in the channel width direction of the semiconductor region 313 are covered with the conductor 316 with the insulator 315 therebetween. The effective channel width is increased in the Fin-type transistor 300, whereby the on-state characteristics of the transistor 300 can be improved. In addition, since contribution of an electric field of the gate electrode can be increased, the off-state characteristics of the transistor 300 can be improved.

Note that the transistor 300 can be a p-channel transistor or an n-channel transistor.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 illustrated in FIG. 9 is only an example and the structure is not limited thereto; an appropriate transistor can be used in accordance with a circuit structure or a driving method. For example, as in the transistor 500, a structure in which the transistor 300 is formed using an oxide semiconductor may be employed.

An insulator 320, an insulator 322, an insulator 324, and an insulator 326 are stacked sequentially to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to improve planarity.

The insulator 324 is preferably formed using a film with a barrier property that prevents hydrogen and impurities from diffusing from the substrate 311, the transistor 300, or the like into regions where the transistor 500 and the transistor 501 are provided.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 300 and each of the transistor 500 and the transistor 501. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low dielectric constant is used for the interlayer film, the parasitic capacitance generated between wirings can be reduced.

In addition, a conductor 328, a conductor 330, and the like that are electrically connected to the capacitor 600, the transistor 500, or the like are embedded in the insulator 320, the insulator 322, the insulator 324, and the insulator 326. Note that the conductor 328 and the conductor 330 have a function of a plug or a wiring.

A plurality of conductors functioning as plugs or wirings are collectively denoted by the same reference numeral in some cases. Furthermore, in this specification and the like, a wiring and a plug may be a single component. That is, there are cases where part of a conductor functions as a wiring and another part of the conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

An insulator 350, an insulator 352, and an insulator 354 are stacked sequentially over the insulator 326 and the conductor 330. Furthermore, a conductor 356 is formed in the insulator 350, the insulator 352, and the insulator 354. The conductor 356 has a function of a plug or a wiring that is electrically connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 300 can be separated from the transistor 500 and the transistor 501 by a barrier layer, so that the diffusion of hydrogen from the transistor 300 into the transistor 500 and the transistor 501 can be inhibited.

Note that for the conductor having a barrier property against hydrogen, tantalum nitride is preferably used, for example. The use of a stack including tantalum nitride and tungsten having high conductivity can inhibit the diffusion of hydrogen from the transistor 300 while the conductivity of a wiring is kept. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 9, an insulator 360, an insulator 362, and an insulator 364 are provided to be stacked sequentially. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 300 can be separated from the transistor 500 and the transistor 501 by a barrier layer, so that the diffusion of hydrogen from the transistor 300 into the transistor 500 and the transistor 501 can be inhibited.

An insulator 370, an insulator 372, and an insulator 374 are stacked sequentially over the insulator 364 and the conductor 366. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 300 can be separated from the transistor 500 and the transistor 501 by a barrier layer, so that the diffusion of hydrogen from the transistor 300 into the transistor 500 and the transistor 501 can be inhibited.

An insulator 380, an insulator 382, and an insulator 384 are stacked sequentially over the insulator 374 and the conductor 376. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 300 can be separated from the transistor 500 and the transistor 501 by a barrier layer, so that the diffusion of hydrogen from the transistor 300 into the transistor 500 and the transistor 501 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 511, an insulator 512, an insulator 514, an insulator 515, and an insulator 516 are stacked sequentially over the insulator 384. A substance having a barrier property against oxygen or hydrogen is preferably used for one of the insulator 511, the insulator 512, the insulator 514, the insulator 515, and the insulator 516.

For example, the insulator 511 and the insulator 514 are preferably formed using a film having a barrier property that prevents diffusion of hydrogen or impurities from the substrate 311, the region where the transistor 300 is provided, or the like into the region where the transistor 500, the transistor 501, and the like are provided, for example. Therefore, a material similar to that for the insulator 324 can be used.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 300 and each of the transistor 500 and the transistor 501. The film that inhibits hydrogen diffusion is specifically a film from which a small amount of hydrogen is released.

For the film having a barrier property against hydrogen used as the insulator 511 and the insulator 514, for example, a metal oxide such as aluminum oxide, hafnium oxide, or tantalum oxide is preferably used.

In particular, aluminum oxide has a high blocking effect that inhibits the passage of both oxygen and impurities such as hydrogen and moisture which are factors of a change in electrical characteristics of the transistor. Accordingly, aluminum oxide can prevent entry of impurities such as hydrogen and moisture into the transistor 500 and the transistor 501 in a fabrication process and after the fabrication of the transistor. Furthermore, release of oxygen from the oxide included in the transistor 500 and the transistor 501 can be inhibited. Thus, aluminum oxide is suitably used as a protective film for the transistor 500 and the transistor 501.

The insulator 512 and the insulator 516 can be formed using a material similar to that for the insulator 320, for example. When a material with a relatively low permittivity is used for an interlayer film, the parasitic capacitance between wirings can be reduced. Silicon oxide films, silicon oxynitride films, or the like can be used as the insulator 512 and the insulator 516, for example.

A conductor 518, a conductor included in the transistor 500 (a conductor 503), and the like are embedded in the insulator 511, the insulator 512, the insulator 514, the insulator 515, and the insulator 516. Note that the conductor 518 has a function of a plug or a wiring that is electrically connected to the capacitor 600 or the transistor 300. The conductor 518 can be provided using a material similar to those for the conductor 328 and the conductor 330.

In particular, the conductor 518 in a region in contact with the insulator 511 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 and the transistor 501 can be inhibited.

The transistor 500 and the transistor 501 are provided above the insulator 516.

As illustrated in FIG. 9, FIG. 10(A), and FIG. 10(B), in the transistor 500, the conductor 503 and the insulator 515 that covers a side surface of the conductor 503 are provided over the insulator 514. The insulator 516 (see FIG. 9) is provided over the insulator 515. The transistor 500 includes an insulator 521 positioned over the insulator 516 and the conductor 503; an insulator 522 positioned over the insulator 521; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; a conductor 560 positioned in the opening; an insulator 550 positioned between the conductor 560 and the oxide 530b, the conductor 542a, the conductor 542b, and the insulator 580; and an oxide 530c positioned between the insulator 550 and the oxide 530b, the conductor 542a, the conductor 542b, and the insulator 580.

Note that the transistor 501 has a structure similar to that of the transistor 500. The details of the transistor 501 can be understood by replacement of the transistor 500 with the transistor 501. Therefore, the detailed description of the transistor 501 is omitted.

As illustrated in FIGS. 10(A) and 10(B), an insulator 544 is preferably positioned between the insulator 580 and the oxide 530a, the oxide 530b, the conductor 542a, and the conductor 542b. In addition, as illustrated in FIGS. 10(A) and 10(B), the conductor 560 preferably includes a conductor 560a provided inside the insulator 550 and a conductor 560b embedded inside the conductor 560a. Moreover, as illustrated in FIGS. 10(A) and 10(B), an insulator 574 is preferably positioned over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542.

The transistor 500 has a structure in which three layers of the oxide 530a, the oxide 530b, and the oxide 530c are stacked in the region where the channel is formed and its vicinity; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be provided. Although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 9 and FIGS. 10(A) and 10(B) is an example, and the structure is not limited thereto; an appropriate transistor can be used in accordance with a circuit structure or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping the conductor 542a or the conductor 542b. Thus, parasitic capacitance formed between the conductor 560 and each of the conductor 542a and the conductor 542b can be reduced. As a result, the transistor 500 can have improved switching speed and excellent frequency characteristics.

The conductor 560 sometimes functions as a first gate (also referred to as top gate) electrode. The conductor 503 sometimes functions as a second gate (also referred to as bottom gate) electrode. In that case, Vth of the transistor 500 can be controlled by changing a potential applied to the conductor 503 independently of a potential applied to the conductor 560. In particular, Vth of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to be overlapped by the oxide 530 and the conductor 560. Thus, when potentials are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

The insulator 521, the insulator 522, the insulator 524, and the insulator 550 have a function of a gate insulator.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

In the case where the insulator 524 includes an excess-oxygen region, it is preferred that the insulator 522 have a function of inhibiting diffusion of oxygen (e.g., an oxygen atom, an oxygen molecule, or the like) (the oxygen is less likely to pass).

When the insulator 522 has a function of inhibiting diffusion of oxygen or impurities, oxygen contained in the oxide 530 is not diffused to the insulator 521 side, which is preferable. Furthermore, the conductor 503 can be prevented from reacting with oxygen contained in the insulator 524 or the oxide 530.

For example, the insulator 522 is preferably formed using a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba, Sr)TiO$_3$(BST). As miniaturization and high integration of the transistor progress, a problem such as leakage current may arise because of a thinner gate insulator. When a high-k material is used for an insulator functioning as the gate insulator, a gate potential during operation of the transistor can be reduced while the physical thickness of the gate insulator is maintained.

It is particularly preferable to use an insulator containing an oxide of one or both of aluminum and hafnium, which is an insulating material having a function of inhibiting diffusion of impurities, oxygen, and the like (the oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 521 be thermally stable. For example, silicon oxide and silicon oxynitride, which have thermal stability, are preferable. In addition, a combination of an insulator of a high-k material and silicon oxide or silicon oxynitride allows the insulator 521 to have a stacked-layer structure with thermal stability and a high dielectric constant.

Note that the insulator 521, the insulator 522, and the insulator 524 may each have a stacked-layer structure of four or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

The metal oxide functioning as the channel formation region in the oxide 530 has a band gap of preferably 2 eV or higher, further preferably 2.5 eV or higher. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of oxides that differ in the atomic ratio of metal atoms. Specifically, the atomic proportion of the element M in constituent elements in the metal oxide used as the oxide 530a is preferably greater than the atomic proportion of the element M in constituent elements in the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a. A metal oxide that can be used for the oxide 530a or the oxide 530b can be used for the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542 (the conductor 542a and the conductor 542b) functioning as the source electrode and the drain electrode is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 10(A), a region 543 (a region 543a and a region 543b) is sometimes formed as a low-resistance region at and near the interface between the oxide 530 and the conductor 542. In that case, the region 543a functions as one of a source region and a drain region, and the region 543b functions as the other of the source region and the drain region. The channel formation region is formed in a region between the region 543a and the region 543b.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier density of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542 is an oxidation-resistant material or does not significantly lose its conductivity even after absorbing oxygen. Design is appropriately set in consideration of required transistor characteristics.

The insulator 515 suppresses oxidation of the side surface of the conductor 503. The insulator 515 can be formed using a material similar to that of the insulator 544. In addition, a region where the insulator 515 and the insulator 544 are in contact with each other may be provided outside the transistor 500.

The insulator 550 functions as a gate insulator. The insulator 550 is preferably positioned in contact with the inner side (the top surface and the side surface) of the oxide 530c. The insulator 550 is preferably formed using an insulator from which oxygen is released by heating. An oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in thermal desorption spectroscopy analysis (TDS analysis) is used, for example. Note that the temperature of the film surface in the TDS analysis is preferably higher than or equal to 100° C. and lower than or equal to 700° C.

Specifically, it is possible to use any of silicon oxide including excess oxygen, silicon oxynitride, silicon nitride oxide, silicon nitride, silicon oxide to which fluorine is added, silicon oxide to which carbon is added, silicon oxide to which carbon and nitrogen are added, and porous silicon oxide. In particular, silicon oxide and silicon oxynitride are preferable because of their thermal stability. Note that in this specification and the like, oxygen released from an insulator, a conductor, and the like by heating is referred to as "excess oxygen".

When an insulator containing excess oxygen is provided as the insulator 550 in contact with the top surface of the oxide 530c, oxygen can be efficiently supplied from the insulator 550 to the channel formation region of the oxide 530b through the oxide 530c. Furthermore, as in the insulator 524, the concentration of impurities such as water and hydrogen in the insulator 550 is preferably reduced. The thickness of the insulator 550 is preferably greater than or equal to 1 nm and less than or equal to 20 nm.

To efficiently supply excess oxygen in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidization of the conductor 560 due to excess oxygen can be inhibited. For the metal oxide, a material that can be used for the insulator 544 is used.

Although the conductor 560 functioning as the first gate electrode has a two-layer structure in FIGS. 10(A) and 10(B), a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting oxygen diffusion, it is possible to prevent a reduction in conductivity of the conductor 560b due to oxidation caused by oxygen contained in the insulator

550. As a conductive material having a function of inhibiting oxygen diffusion, for example, tantalum, tantalum nitride, ruthenium, ruthenium oxide, or the like is preferably used.

The conductor 560*b* is preferably formed using a conductive material containing tungsten, copper, or aluminum as its main component. The conductor 560*b* also functions as a wiring and thus is preferably formed using a conductor having high conductivity. For example, a conductive material containing tungsten, copper, or aluminum as its main component can be used. The conductor 560*b* may have a stacked-layer structure, for example, a stacked-layer structure of any of the above conductive materials and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because of their thermal stability. Silicon oxide and porous silicon oxide are particularly preferable because an excess-oxygen region can be formed easily in a later step.

The insulator 580 preferably includes an excess-oxygen region. When the insulator 580 from which oxygen is released by heating is provided in contact with the oxide 530*c*, oxygen in the insulator 580 can be efficiently supplied to the oxide 530 through the oxide 530*c*. Note that the concentration of impurities such as water and hydrogen in the insulator 580 is preferably lowered.

The opening of the insulator 580 is formed to overlap with a region between the conductor 542*a* and the conductor 542*b*. Accordingly, the conductor 560 is formed to be embedded in the opening of the insulator 580 and the region between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; hence, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water and hydrogen in the insulator 581 is preferably lowered.

A conductor 546 (a conductor 546*a* and a conductor 546*b*) is positioned in openings formed in the insulator 581, the insulator 574, the insulator 580, and the insulator 544. The conductor 546*a* and the conductor 546*b* are provided to face each other with the conductor 560 therebetween.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. When a material with a relatively low permittivity is used for an interlayer film, the parasitic capacitance between wirings can be reduced. For example, a silicon oxide film, a silicon oxynitride film, or the like can be used for the insulator 586.

An insulator 587 is provided over the insulator 586. For the insulator 587, a material similar to that for the insulator 514 can be used. The use of an insulating material having a resistivity higher than or equal to $1 \times 10^{10}$ Ωcm and lower than or equal to $1 \times 10^{15}$ Ωcm for the insulator 587 can reduce plasma damage caused in deposition, etching, or the like. For example, silicon nitride having a resistivity lower than or equal to $1 \times 10^{14}$ Ωcm, preferably lower than or equal to $1 \times 10^{13}$ Ωcm is used as the insulator 587. Note that an insulating material having a resistivity higher than or equal to $1 \times 10^{10}$ Ωcm and lower than or equal to $1 \times 10^{15}$ Ωcm may be used not only for the insulator 587 but also for the other insulators. For example, silicon nitride having a resistivity lower than or equal to $1 \times 10^{14}$ Ωcm, preferably lower than or equal to $1 \times 10^{13}$ Ωcm may be used for the insulator 515, the insulator 574, and/or the insulator 582.

The conductor 546 and the like are embedded in the insulator 544, the insulator 580, the insulator 574, the insulator 581, the insulator 582, the insulator 586, and the insulator 587. A conductor 548 and the like are embedded in the insulator 521, the insulator 522, the insulator 544, the insulator 580, the insulator 574, the insulator 581, the insulator 582, the insulator 586, and the insulator 587.

The conductor 546 and the conductor 548 have functions of plugs or wirings that are electrically connected to the capacitor 600, the transistor 500, or the transistor 300. The conductor 546 and the conductor 548 can be provided using a material similar to those for the conductor 328 and the conductor 330.

In addition, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is electrically connected to the transistor 500 or the like. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each of which has a single-layer structure are illustrated in FIG. 9, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device using a transistor including an oxide semiconductor. Alternatively, it is possible to provide a transistor including an oxide semiconductor with high on-state current. Alternatively, it is possible to provide a transistor including an oxide semiconductor with low off-state current. Alternatively, it is possible to provide a semiconductor device with reduced power consumption. Alternatively, a semiconductor device using a transistor including an oxide semiconductor can be miniaturized or highly integrated.

Transistor Structure Examples

Note that the structure of the transistor 500 in the semiconductor device described in this embodiment is not limited to the above. Examples of structures that can be used for the transistor 500 will be described below.

Transistor Structure Example 1

A structure example of a transistor 510A is described with reference to FIG. 11(A) to FIG. 11(C). FIG. 11(A) is a top view of the transistor 510A. FIG. 11(B) is a cross-sectional view of a portion indicated by a dashed-dotted line L1-L2 in FIG. 11(A). FIG. 11(C) is a cross-sectional view of a portion indicated by a dashed-dotted line W1-W2 in FIG. 11(A). Note that for clarity of the drawing, some components are not illustrated in the top view of FIG. 11(A).

The transistor 510A is a variation example of the transistor 500. Therefore, what is different from the transistor 500 is mainly described to reduce repeated description.

The transistor 510A includes the conductor 560 (the conductor 560a and the conductor 560b) functioning as a first gate electrode; the conductor 503 functioning as a second gate electrode; the insulator 550 functioning as a first gate insulating film; the insulator 521, the insulator 522, and the insulator 524 that function as a second gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 544.

In the transistor 510A illustrated in FIG. 11, the insulator 544 covers the side surfaces of the conductor 560 with the oxide 530c and the insulator 550 therebetween. Such a structure can prevent entry of impurities through the side surface of the conductor 560.

In the transistor 510A, the conductor 560 sometimes functions as a first gate (also referred to as top gate) electrode. The conductor 503 sometimes functions as a second gate (also referred to as bottom gate) electrode. Accordingly, the insulator 550 sometimes functions as a first gate insulator. The insulator 521, the insulator 522, and the insulator 524 sometimes function as a second gate insulator.

FIG. 11 illustrates a three-layer stacked structure of the second gate insulator, but the second gate insulator may have a stacked-layer structure including two or less layers or four or more layers. In that case, without limitation to a stacked-layer structure formed of the same material, a stacked-layer structure formed of different materials may be employed.

As miniaturization and high integration of the transistor progress, a problem such as leakage current may arise because of a thinner gate insulator. In that case, the insulator 550 may have a stacked-layer structure like the second gate insulator. When the insulator functioning as the gate insulator has a stacked-layer structure of a high-k material and a thermally stable material, a gate potential during operation of the transistor can be reduced while the physical thickness is maintained. Furthermore, the stacked-layer structure can be thermally stable and have a high dielectric constant.

One of the conductor 542a and the conductor 542b functions as a source electrode, and the other functions as a drain electrode. A barrier layer may be provided over the conductor 542. The barrier layer is preferably formed using a material having a barrier property against oxygen or hydrogen. This structure can inhibit oxidation of the conductor 542 at the time of deposition of the insulator 544.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The conductor 560 functioning as a first gate electrode includes the conductor 560a and the conductor 560b over the conductor 560a. The conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

As a conductive material having a function of inhibiting oxygen diffusion, for example, tantalum, tantalum nitride, ruthenium, or ruthenium oxide is preferably used. For the conductor 560a, the oxide semiconductor that can be used as the oxide 530 can be used. In that case, when the conductor 560b is deposited by a sputtering method, the conductor 560a can have a reduced electric resistance to be a conductor. This can be referred to as an OC (Oxide Conductor) electrode.

The conductor 560b is preferably formed using a conductive material containing tungsten, copper, or aluminum as its main component. The conductor 560 functions as a wiring and thus is preferably formed using a conductor having high conductivity. For example, a conductive material containing tungsten, copper, or aluminum as its main component can be used. The conductor 560b may have a stacked-layer structure, for example, a stack of any of the above conductive materials and titanium or titanium nitride.

The transistor 510A may be electrically connected to another component through a plug or a wiring such as the conductor 546 embedded in the insulator 580, the insulator 574, and the insulator 581.

The insulator 515 and the insulator 516 may be provided to be adjacent to the side surface of the conductor 503. Such a structure can be obtained in the following manner: insulating films to be the insulator 515 and the insulator 516 are deposited over the patterned conductor 503, and upper portions of the insulating films are removed by a CMP method or the like until the top surface of the conductor 503 is exposed.

Preferably, the planarity of the top surface of the conductor 503 is made favorable. For example, the average surface roughness (Ra) of the top surface of the conductor 503 is less than or equal to 1 nm, preferably less than or equal to 0.5 nm, further preferably less than or equal to 0.3 nm. This allows the improvement in planarity of an insulating layer formed over the conductor 503 and the increase in crystallinity of the oxide 530.

The insulator 544 and the insulator 515 may be in contact with each other in a region other than a region in which the transistor 510A is formed (see FIG. 11(B)). Such a structure can be obtained in the following manner: part of the insulator 516 is removed to expose part of the insulator 515 and then the insulator 544 is deposited.

As a material for the conductor 546, a single layer or a stacked layer of a conductive material such as a metal material, an alloy material, a metal nitride material, or a metal oxide material can be used. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is maintained.

With the above structure, a semiconductor device including a transistor that contains an oxide semiconductor and has a high on-state current can be provided. Alternatively, a semiconductor device including a transistor that contains an oxide semiconductor and has a low off-state current can be provided. Alternatively, a semiconductor device that has small variations in electrical characteristics, stable electrical characteristics, and high reliability can be provided.

Transistor Structure Example 2

Figure 12A:
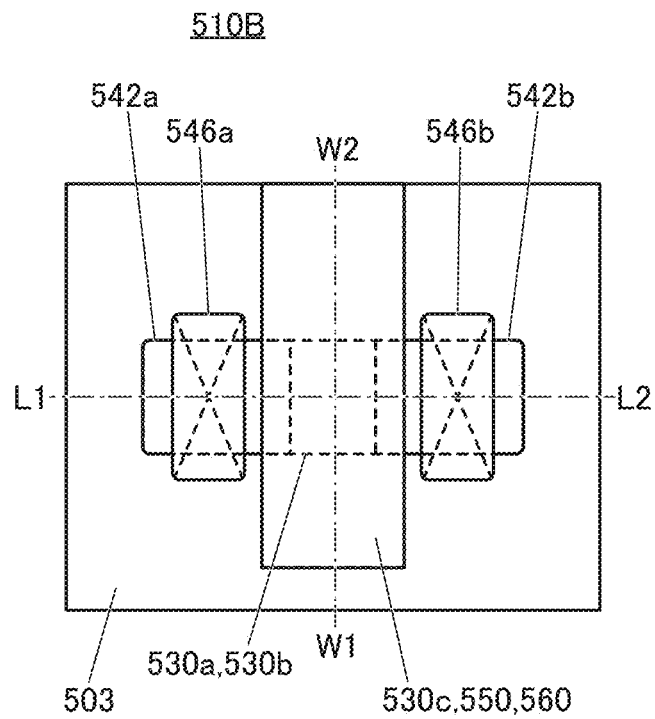
FIG. 12(A) A top view illustrating a structure example of a transistor, and (B), (C) cross-sectional views illustrating the structure example of the transistor.
Figure 12C:
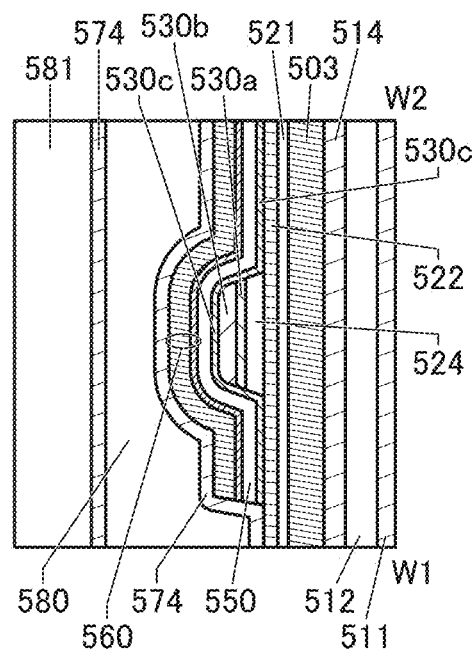
Figure 12B:
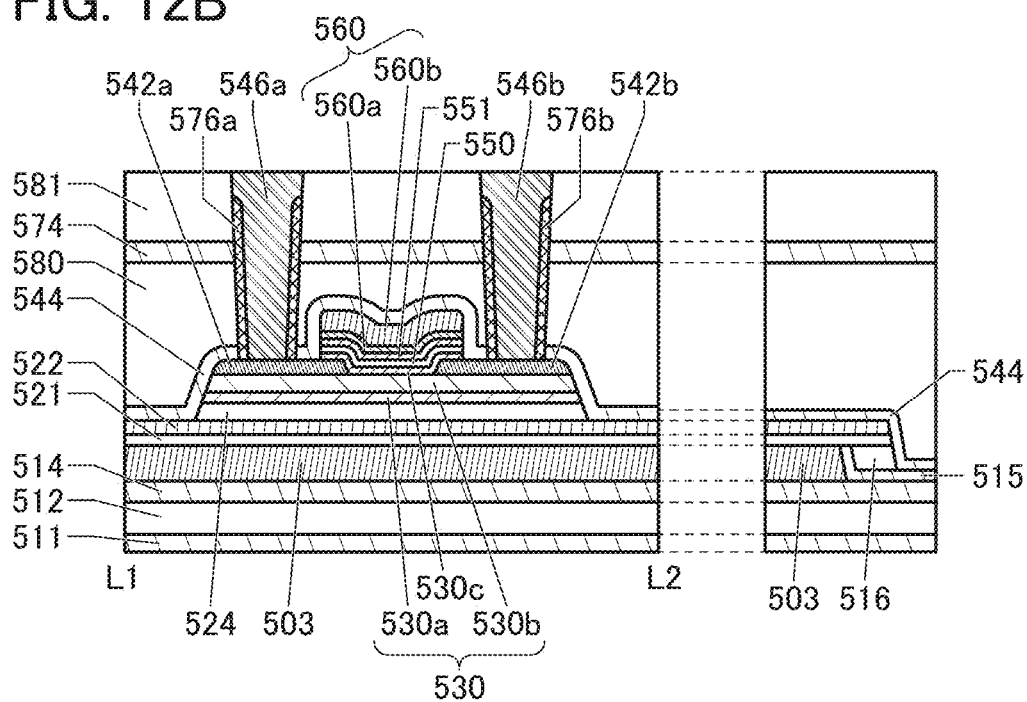

A structure example of a transistor 510B is described with reference to FIG. 12(A) to FIG. 12(C). FIG. 12(A) is a top view of the transistor 510B. FIG. 12(B) is a cross-sectional view of a portion indicated by a dashed-dotted line L1-L2 in FIG. 12(A). FIG. 12(C) is a cross-sectional view of a portion indicated by a dashed-dotted line W1-W2 in FIG. 12(A). Note that for clarity of the drawing, some components are not illustrated in the top view of FIG. 12(A).

The transistor 510B is a variation example of the transistor 510A. Therefore, what is different from the transistor 510A is mainly described to reduce repeated description.

The transistor 510B includes a region where the conductor 542 (the conductor 542a and the conductor 542b) overlaps with the oxide 530c, the insulator 550, an oxide 551, and the conductor 560. With this structure, a transistor having a high on-state current can be provided. Moreover, a transistor having high controllability can be provided.

The conductor 560 functioning as a first gate electrode includes the conductor 560a and the conductor 560b over the conductor 560a. The conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

In addition, to adjust Vth of the transistor, a material used for the conductor 560a may be determined in consideration of a work function. For example, the conductor 560a may be formed using titanium nitride, and the conductor 560b may be formed using tungsten. The conductor 560a and the conductor 560b is formed by a known deposition method such as a sputtering method or a CVD method. Note that the deposition temperature in the case where titanium nitride is deposited by a CVD method is preferably higher than or equal to 380° C. and lower than or equal to 500° C., further preferably higher than or equal to 400° C. and lower than or equal to 450° C.

The oxide 551 may be formed using a material similar to those of the other insulators. As the oxide 551, a metal oxide such as an In-M-Zn oxide containing excess oxygen (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) may be used. For example, as the oxide 551, an In—Ga—Zn oxide is deposited by a sputtering method. Specifically, for example, deposition is performed using a target with an atomic ratio of In:Ga:Zn=1:3:4 and a sputtering gas containing oxygen. In the case where the oxide 551 is deposited by a sputtering method, the flow rate ratio of oxygen contained in the sputtering gas is preferably higher than or equal to 70%, further preferably higher than or equal to 80%, still further preferably 100%.

When a gas containing oxygen is used as a sputtering gas, oxygen can be supplied not only to the oxide 551 but also to the insulator 550 that is a formation surface of the oxide 551. Furthermore, when the flow rate ratio of oxygen contained in the sputtering gas is increased, the amount of oxygen supplied to the insulator 550 can be increased.

Moreover, when the oxide 551 is provided over the insulator 550, excess oxygen contained in the insulator 550 is unlikely to be diffused into the conductor 560. Thus, the reliability of the transistor can be increased. Note that the oxide 551 may be omitted depending on purposes or the like.

The insulator 544 is preferably provided to cover the top surface and the side surface of the conductor 560, a side surface of the insulator 550, and a side surface of the oxide 530c. For the insulator 544, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 544 can inhibit oxidation of the conductor 560. Moreover, the insulator 544 can inhibit diffusion of impurities such as water and hydrogen contained in the insulator 580 into the transistor 510B.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Furthermore, with the insulator 576 having a barrier property, the range of choices for the material of the conductor used as the plug or the wiring can be expanded. A metal material having an oxygen absorbing property and high conductivity can be used for the conductor 546, for example.

Transistor Structure Example 3

Figure 13A:
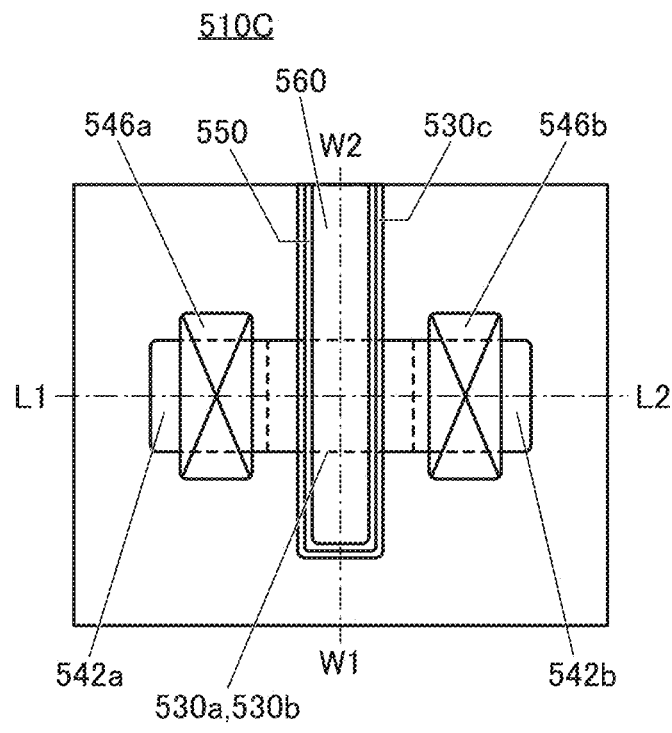
FIG. 13(A) A top view illustrating a structure example of a transistor, and (B), (C) cross-sectional views illustrating the structure example of the transistor.
Figure 13C:
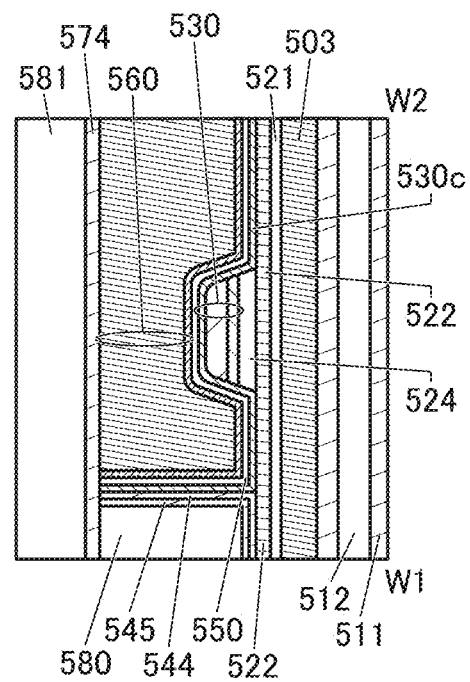
Figure 13B:
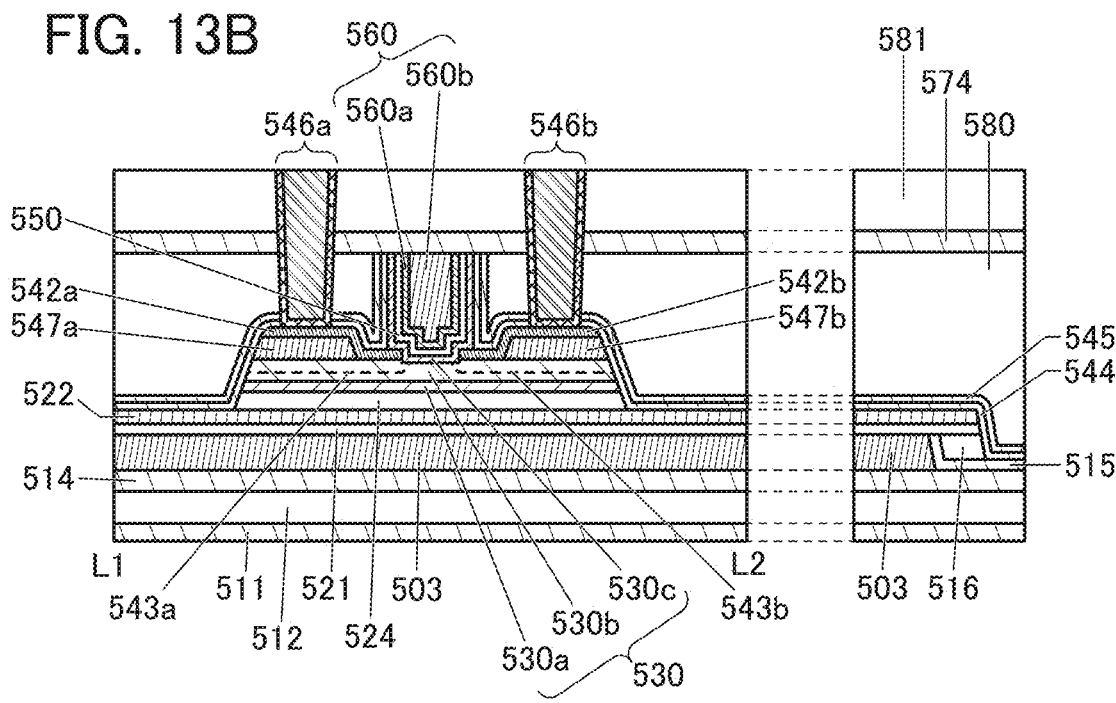

A structure example of a transistor 510C is described with reference to FIG. 13(A) to FIG. 13(C). FIG. 13(A) is a top view of the transistor 510C. FIG. 13(B) is a cross-sectional view of a portion indicated by a dashed-dotted line L1-L2 in FIG. 13(A). FIG. 13(C) is a cross-sectional view of a portion indicated by a dashed-dotted line W1-W2 in FIG. 13(A). Note that for clarity of the drawing, some components are not illustrated in the top view of FIG. 13(A).

The transistor 510C is a variation example of the above transistors. Therefore, what is different from the above transistors is mainly described to reduce repeated description.

In the transistor 510C illustrated in FIG. 13, a conductor 547a is positioned between the conductor 542a and the oxide 530b and a conductor 547b is positioned between the conductor 542b and the oxide 530b. Here, the conductor 542a (the conductor 542b) has a region that extends beyond the top surface and a side surface on the conductor 560 side of the conductor 547a (the conductor 547b) and is in contact with the top surface of the oxide 530b. For the conductors 547, a conductor that can be used for the conductor 542 is used. It is preferred that the thickness of the conductor 547 be at least greater than that of the conductor 542.

In the transistor 510C illustrated in FIG. 13, because of the above structure, the conductor 542 can be closer to the conductor 560 than in the transistor 510A. Alternatively, the conductor 560 and an end portion of the conductor 542a and an end portion of the conductor 542b can overlap with each other. Accordingly, the effective channel length of the transistor 510C can be shortened, and the on-state current and the frequency characteristics can be improved.

The conductor 547a (the conductor 547b) is preferably provided to be overlapped by the conductor 542a (the conductor 542b). With such a structure, the conductor 547a (the conductor 547b) can function as a stopper to prevent over-etching of the oxide 530b in etching for forming the opening in which the conductor 546a (the conductor 546b) is to be embedded.

The transistor 510C illustrated in FIG. 13 may have a structure in which an insulator 545 is positioned on and in contact with the insulator 544. The insulator 544 preferably functions as a barrier insulating film that inhibits entry of impurities such as water and hydrogen and excess oxygen into the transistor 510C from the insulator 580 side. For the insulator 545, an insulator that can be used for the insulator 544 can be used. In addition, the insulator 544 may be formed using a nitride insulator such as aluminum nitride, aluminum titanium nitride, titanium nitride, silicon nitride, or silicon nitride oxide, for example.

Transistor Structure Example 4

A structure example of a transistor 510D is described with reference to FIG. 14(A) to FIG. 14(C). FIG. 14(A) is a atop view of a transistor 510D. FIG. 14(B) is a cross-sectional view of a portion indicated by a dashed-dotted line L1-L2 in FIG. 14(A). FIG. 14(C) is a cross-sectional view of a portion indicated by a dashed-dotted line W1-W2 in FIG. 14(A). Note that for clarity of the drawing, some components are not illustrated in the top view of FIG. 14(A).

The transistor 510D is a variation example of the above transistors. Therefore, what is different from the above transistors is mainly described to reduce repeated description.

The transistor 510D includes the insulator 550 over the oxide 530c and a metal oxide 552 over the insulator 550. The transistor 510D further includes the conductor 560 over the metal oxide 552 and an insulator 570 over the conductor 560. Moreover, the transistor 510D includes an insulator 571 over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidization of the conductor 560 due to oxygen can be suppressed.

Note that the metal oxide 552 may have a function of part of a first gate electrode. For example, an oxide semiconductor that can be used for the oxide 530 can be used for the metal oxide 552. In this case, when the conductor 560 is deposited by a sputtering method, the metal oxide 552 can have a reduced electric resistance to be a conductive layer. This can be referred to as an OC (Oxide Conductor) electrode.

Note that the metal oxide 552 has a function of part of the gate insulating layer in some cases. Thus, when silicon oxide, silicon oxynitride, or the like is used for the insulator 550, a metal oxide that is a high-k material with a high dielectric constant is preferably used for the metal oxide 552. Such a stacked-layer structure can be thermally stable and can have a high dielectric constant. Thus, a gate potential that is applied during operation of the transistor can be reduced while the physical thickness is kept. In addition, the equivalent oxide thickness (EOT) of the insulating layer functioning as the gate insulating layer can be reduced.

Although the metal oxide 552 in the transistor 510D is shown as a single layer, the metal oxide 552 may have a stacked-layer structure of two or more layers. For example, a metal oxide functioning as part of a gate electrode and a metal oxide functioning as part of the gate insulating layer may be stacked.

With the metal oxide 552 functioning as a gate electrode, the on-state current of the transistor 510D can be increased without a reduction in the influence of the electric field from the conductor 560. With the metal oxide 552 functioning as the gate insulating layer, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the metal oxide 552 is not an essential component. Design is appropriately set in consideration of required transistor characteristics.

For the insulator 570, an insulating material having a function of inhibiting the passage of oxygen and impurities such as water and hydrogen is preferably used. For example, aluminum oxide or hafnium oxide is preferably used. Thus, oxidization of the conductor 560 due to oxygen from above the insulator 570 can be inhibited. Moreover, entry of impurities such as water and hydrogen from above the insulator 570 into the oxide 530 through the conductor 560 and the insulator 550 can be inhibited.

The insulator 571 functions as a hard mask. By providing the insulator 571, the conductor 560 can be processed to have a side surface that is substantially vertical; specifically, an angle formed by the side surface of the conductor 560 and a surface of the substrate can be greater than or equal to 750 and less than or equal to 100°, preferably greater than or equal to 80 and less than or equal to 95°.

An insulating material having a function of inhibiting the passage of oxygen and impurities such as water and hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530$c$ are selected and removed using the insulator 571 as a hard mask, whereby their side surfaces can be substantially aligned with each other and a surface of the oxide 530$b$ can be partly exposed.

The transistor 510D includes a region 531$a$ and a region 531$b$ on part of the exposed surface of the oxide 530$b$. One of the region 531$a$ and the region 531$b$ functions as a source region, and the other functions as a drain region.

The region 531$a$ and the region 531$b$ can be formed by addition of an impurity element such as phosphorus or boron to the exposed surface of the oxide 530$b$ by an ion implantation method, an ion doping method, a plasma immersion ion implantation method, or plasma treatment, for example. In this embodiment and the like, an "impurity element" refers to an element other than main constituent elements.

The region 531$a$ and the region 531$b$ can also be formed in the following manner: a metal film is deposited after part of the surface of the oxide 530$b$ is exposed and then the element in the metal film is diffused into the oxide 530$b$ by heat treatment.

The electrical resistivity of regions of the oxide 530$b$ to which the impurity element is added decreases. For that reason, the region 531$a$ and the region 531$b$ are sometimes referred to "impurity regions" or "low-resistance regions".

The region 531$a$ and the region 531$b$ can be formed in a self-aligned manner by using the insulator 571 and/or the conductor 560 as a mask. Accordingly, the conductor 560 does not overlap with the region 531$a$ and/or the region 531$b$, so that the parasitic capacitance can be reduced. Moreover, an offset region is not formed between a channel formation region and the source/drain region (the region 531$a$ or the region 531$b$). The formation of the region 531$a$ and the region 531$b$ in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and a region where the above-described addition of the impurity element is not performed. The offset region can be formed by the above-described addition of the impurity element after the formation of an insulator 575. In this case, the insulator 575 serves as a mask like the insulator 571 or the like. Thus, the impurity element is not added to a region of the oxide 530$b$ overlapped by the insulator 575, so that the electrical resistivity of the region can be kept high.

The transistor 510D includes the insulator 575 on the side surfaces of the insulator 570, the conductor 560, the metal oxide 552, the insulator 550, and the oxide 530$c$. The insulator 575 is preferably an insulator having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 510D also includes the insulator 544 over the insulator 575 and the oxide 530. The insulator 544 is preferably deposited by a sputtering method. When a sputtering method is used, an insulator containing few impurities such as water and hydrogen can be deposited. For example, aluminum oxide is preferably used for the insulator 544.

Note that an oxide film obtained by a sputtering method may extract hydrogen from the structure body over which the oxide film is deposited. Thus, the hydrogen concentration in the oxide 530 and the insulator 575 can be reduced when the insulator 544 absorbs hydrogen and water from the oxide 530 and the insulator 575.

Transistor Structure Example 5

Figure 15A:
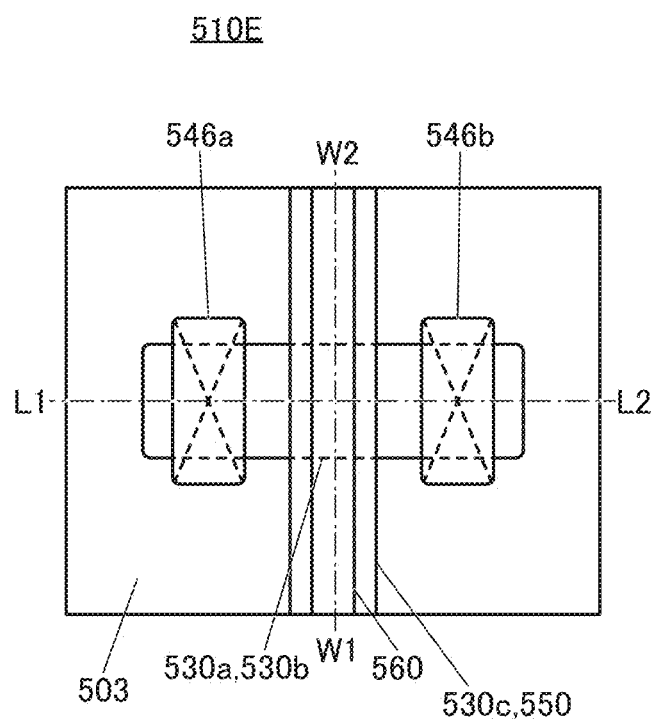
FIG. 15(A) A top view illustrating a structure example of a transistor, and (B), (C) cross-sectional views illustrating the structure example of the transistor.
Figure 15C:
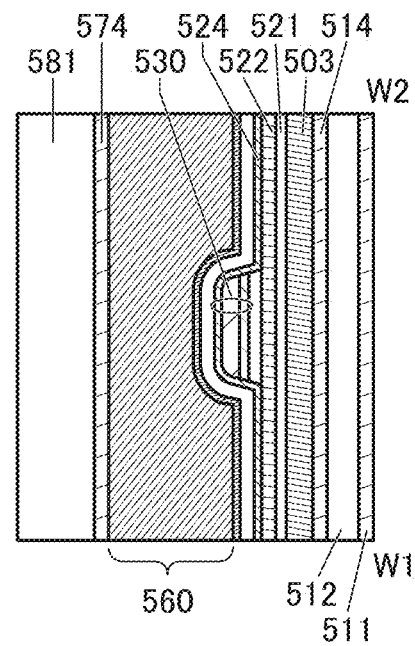
Figure 15B:
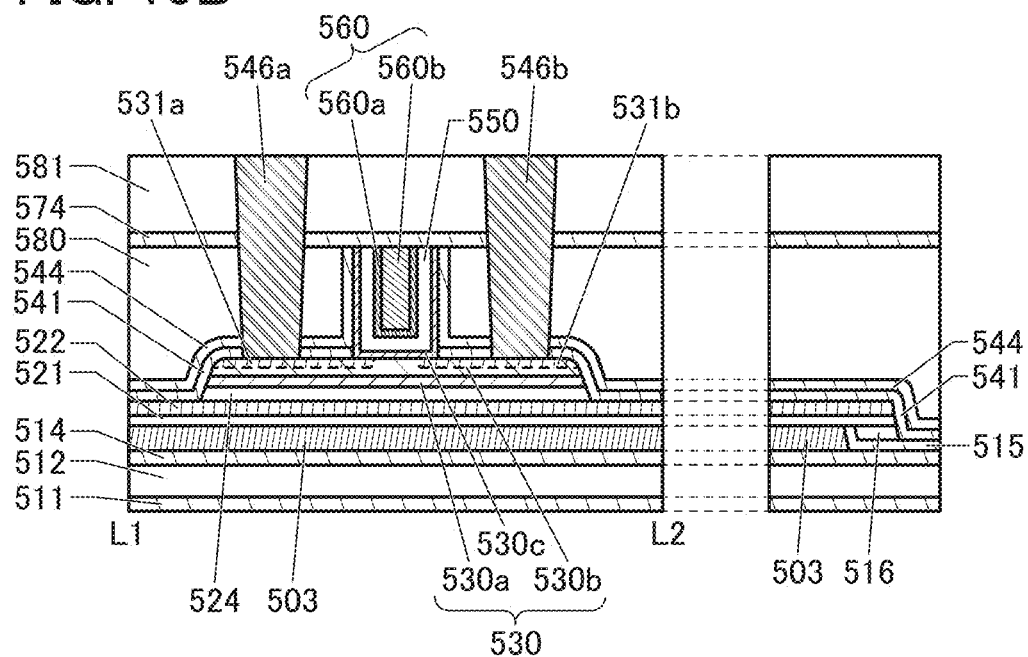

A structure example of a transistor 510E is described with reference to FIG. 15(A) to FIG. 15(C). FIG. 15(A) is a top view of the transistor 510E. FIG. 15(B) is a cross-sectional view of a portion indicated by a dashed-dotted line L1-L2 in FIG. 15(A). FIG. 15(C) is a cross-sectional view of a portion indicated by a dashed-dotted line W1-W2 in FIG. 15(A). Note that for clarity of the drawing, some components are not illustrated in the top view of FIG. 15(A).

The transistor 510E is a variation example of the above transistors. Therefore, differences from the above transistors will be mainly described to avoid repeated description.

In FIGS. 15(A) to 15(C), the conductor 542 is not provided, and part of the exposed surface of the oxide 530b includes the region 531a and the region 531b. One of the region 531a and the region 531b functions as a source region, and the other functions as a drain region. Moreover, an insulator 541 is included between the oxide 530b and the insulator 544.

A region 531 (the region 531a and the region 531b) illustrated in FIG. 15 is a region where the following element is added to the oxide 530b. The region 531 can be formed with the use of a dummy gate, for example.

Specifically, a dummy gate is provided over the oxide 530b, and the above element that reduces the resistance of the oxide 530b is added using the dummy gate as a mask. That is, the element is added to regions of the oxide 530 that are not overlapped by the dummy gate, whereby the region 531 is formed. For the addition of the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Hydrogen, carbon, nitrogen, fluorine, sulfur, chlorine, titanium, a rare gas, or the like can also be used. Typical examples of the rare gas include helium, neon, argon, krypton, and xenon. The concentration of the element is measured by secondary ion mass spectrometry (SIMS) or the like.

In particular, boron and phosphorus are preferably used because an apparatus used in a manufacturing line for amorphous silicon or low-temperature polysilicon can be used. Since the existing facility can be used, capital investment can be reduced.

Next, an insulating film to be the insulator 544 and an insulating film to be the insulator 541 may be deposited over the oxide 530b and the dummy gate. Stacking the insulating film to be the insulator 541 and the insulating film to be the insulator 544 can provide a region where the region 531, the oxide 530c, and the insulator 550 overlap with each other.

Specifically, after an insulating film to be the insulator 580 is provided over the insulating film to be the insulator 544, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 541 in contact with the dummy gate is preferably also removed. Thus, the insulator 544 and the insulator 541 are exposed at a side surface of an opening provided in the insulator 580, and the region 531 provided in the oxide 530b is partly exposed at the bottom surface of the opening. Next, an oxide film to be the oxide 530c, an insulating film to be the insulator 550, and a conductive film to be the conductor 560 are deposited sequentially in the opening, and then, the oxide film to be the oxide 530c, the insulating film to be the insulator 550, and the conductive film to be the conductor 560 are partly removed by CMP treatment or the like until the insulator 580 is exposed; thus, the transistor illustrated in FIG. 15 can be formed.

Note that the insulator 541 and the insulator 544 are not essential components. Design is appropriately set in consideration of required transistor characteristics.

The cost of the transistor illustrated in FIG. 15 can be reduced because an existing apparatus can be used and the conductor 542 is not provided.

This embodiment can be implemented in combination with the other embodiments and example described in this specification as appropriate.

Embodiment 3

In this embodiment, the composition of a metal oxide that can be used in the OS transistor described in the above embodiment will be described.

<Composition of Metal Oxide>

Note that in this specification and the like, CAAC (c-axis aligned crystal) and CAC (Cloud-Aligned Composite) might be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors can be classified into a single crystal oxide semiconductor and a non-single-crystal oxide semiconductor. Examples of the non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

For an oxide semiconductor used for a semiconductor of the transistor, a thin film having high crystallinity is preferably used. With the use of the thin film, the stability or reliability of the transistor can be improved. Examples of the thin film include a thin film of a single crystal oxide semiconductor and a thin film of a polycrystalline oxide semiconductor. However, to form the thin film of a single crystal oxide semiconductor or the thin film of a polycrystalline oxide semiconductor over a substrate, a high-temperature process or a laser heating process is needed. Thus, manufacturing cost is increased, and throughput is decreased.

Non-Patent Document 2 and Non-Patent Document 3 have reported that an In—Ga—Zn oxide having a CAAC structure (referred to as CAAC-IGZO) was found in 2009. Here, it has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 4). Here, it has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 5 and Non-Patent Document 6 have shown a change in average crystal size due to electron beam irradiation to thin films of the above CAAC-IGZO, the above nc-IGZO, and IGZO having low crystallinity. In the thin film of IGZO having low crystallinity, crystalline IGZO with a size of approximately 1 nm was observed even before electron beam irradiation. Thus, here, it has been reported that the existence of a completely amorphous structure could not be observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for the semiconductor of the transistor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to the low density of oxygen atom arrangement in the a-b plane direction, a change in interatomic bond distance by replacement of a metal element, and the like.

Furthermore, the CAAC-OS tends to have a layered crystal structure (also referred to as a layered structure) in which a layer containing indium and oxygen (hereinafter referred to as an In layer) and a layer containing the element M, zinc, and oxygen (hereinafter referred to as an (M, Zn) layer) are stacked. Note that indium and the element M can be replaced with each other, and when the element M in the (M, Zn) layer is replaced with indium, the layer can also be referred to as an (In, M, Zn) layer. Furthermore, when indium in the In layer is replaced with the element M, the layer can be referred to as an (In, M) layer.

The CAAC-OS is an oxide semiconductor with high crystallinity. On the other hand, a clear grain boundary cannot be observed in the CAAC-OS; thus, it can be said that a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability. In addition, the CAAC-OS is stable with respect to high temperature in the manufacturing process (what is called thermal budget). Accordingly, the use of the CAAC-OS for the OS transistor can extend a degree of freedom of the manufacturing process.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor depending on the analysis method.

The a-like OS is an oxide semiconductor that has a structure between those of the nc-OS and the amorphous oxide semiconductor. The a-like OS contains a void or a low-density region. That is, the a-like OS has lower crystallinity than the nc-OS and the CAAC-OS.

An oxide semiconductor has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

Note that when the above oxide semiconductor is used for a transistor, a transistor with high field-effect mobility can be achieved. In addition, a transistor having high reliability can be achieved.

Non-Patent Document 7 shows that the transistor using an oxide semiconductor has an extremely low leakage current in an off state; specifically, the off-state current per micrometer in the channel width of the transistor is of the order of yA/μm ($10^{-24}$ A/μm). For example, a low-power-consumption CPU utilizing a characteristic of a low leakage current of the transistor using an oxide semiconductor is disclosed (see Non-Patent Document 8).

Furthermore, application of a transistor using an oxide semiconductor to a display device that utilizes the characteristic of a low leakage current of the transistor has been reported (see Non-Patent Document 9). In the display device, a displayed image is changed several tens of times per second. The number of times an image is changed per second is referred to as a refresh rate. The refresh rate is also referred to as drive frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate can reduce the power consumption of the display device. Such a driving method is referred to as idling stop (IDS) driving.

In addition, an oxide semiconductor with a low carrier density is preferably used for a transistor. In the case where the carrier density of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. For example, the carrier density of the oxide semiconductor is set lower than $8\times10^{11}$/cm$^3$, preferably lower than $1\times10^{11}$/cm$^3$, further preferably lower than $1\times10^{10}$/cm$^3$, and greater than or equal to $1\times10^{-9}$/cm$^3$.

In addition, a highly purified intrinsic or substantially highly purified intrinsic oxide semiconductor film has a low density of defect states and thus has a low density of trap states in some cases.

Furthermore, electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Thus, in order to stabilize electrical characteristics of the transistor, reducing the impurity concentration in the oxide semiconductor is effective. Furthermore, in order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of the Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

Furthermore, when the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase of carrier density. As a result, a transistor using an oxide semiconductor containing nitrogen as a semiconductor is likely to have normally-on characteristics. For this reason, nitrogen in the oxide semiconductor is preferably reduced as much as possible. For example, the concentration of nitrogen in the oxide semiconductor measured by SIMS is set to lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

In addition, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

The finding of the CAAC structure and the nc structure has contributed to improvements in electrical characteristics and reliability of a transistor using an oxide semiconductor having the CAAC structure or the nc structure, a reduction in manufacturing cost, and an improvement in throughput. Furthermore, applications of the transistor to a display device and an LSI utilizing the property of low leakage current of the transistor have been studied.

Note that this embodiment can be implemented in combination with the other embodiments and example described in this specification as appropriate.

Embodiment 4

In this embodiment, examples of electronic devices in which the storage device described in the above embodiment is provided will be described.

The storage device of one embodiment of the present invention can be provided in a variety of electronic devices. In particular, the storage device of one embodiment of the present invention can be used as a memory incorporated in an electronic device. Examples of electronic devices include a digital camera, a digital video camera, a digital photo frame, a mobile phone, a portable game machine, a portable information terminal, and an audio reproducing device in addition to electronic devices provided with comparatively large screens, such as a television device, a desktop or laptop personal computer, a monitor for a computer or the like, digital signage, and a large game machine like a pachinko machine.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 16 illustrates examples of electronic devices.

FIG. 16(A) illustrates a mobile phone (smartphone), which is a type of information terminal. An information terminal 5500 includes a housing 5510 and a display portion 5511. As input interfaces, a touch panel is provided in the display portion 5511 and a button is provided in the housing 5510.

FIG. 16(B) illustrates a desktop information terminal 5300. The desktop information terminal 5300 includes a main body 5301 of the information terminal, a display 5302, and a keyboard 5303.

Note that in the above description, a smartphone and a desktop information terminal are illustrated as examples of the electronic devices in FIGS. 16(A) and 16(B); alternatively, an information terminal other than a smartphone and a desktop information terminal can be used. Examples of an information terminal other than the smartphone and the desktop information terminal include a PDA (Personal Digital Assistant), a notebook information terminal, and a workstation.

FIG. 16(C) illustrates an electric refrigerator-freezer 5800 as an example of a household appliance. The electric refrigerator-freezer 5800 includes a housing 5801, a refrigerator door 5802, a freezer door 5803, and the like.

Although the electric refrigerator-freezer is described in this example as an electric appliance, examples of other electric appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

FIG. 16(D) illustrates a portable game machine 5200 as an example of a game machine. The portable game machine includes a housing 5201, a display portion 5202, a button 5203, and the like.

Although the portable game machine is illustrated as an example of a game machine in FIG. 16(D), game machines in which the storage device of one embodiment of the present invention can be used are not limited thereto. Examples of game machines in which the storage device of one embodiment of the present invention can be used include a home stationary game console, an arcade game machine installed in an entertainment facility (a game center, an amusement park, or the like), and a throwing machine for batting practice installed in sports facilities.

FIG. 16(E1) shows an automobile 5700 as an example of a moving vehicle, and FIG. 16(E2) is a diagram illustrating the periphery of a windshield inside the automobile. FIG. 16(E2) illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for the view obstructed by the pillar (blind areas) by projecting an image taken by an imaging device (not illustrated) provided for the automobile 5700. That is, displaying an image taken by the imaging device provided outside the automobile 5700 leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Note that although an automobile is described above as an example of a moving vehicle, the moving vehicle is not limited to an automobile. Examples of moving vehicles include a train, a monorail train, a ship, and a flying object (a helicopter, an unmanned aircraft (a drone), an airplane, and a rocket), and these moving vehicles can include the storage device of one embodiment of the present invention.

The storage device of one embodiment of the present invention can retain data for a long time even in a high-temperature environment and can operate at high speed even in a low-temperature environment. The use of the storage device of one embodiment of the present invention in the above-described various electronic devices can provide highly reliable electronic devices that can surely operate either in a high-temperature environment or in a low-temperature environment. Moreover, power consumption of an electronic device can be reduced.

Note that this embodiment can be implemented in combination with the other embodiments and example described in this specification as appropriate.

Example

Figure 17A:
FIG. 17(A), (B) Diagrams illustrating cross sections of a transistor.
Figure 17B:
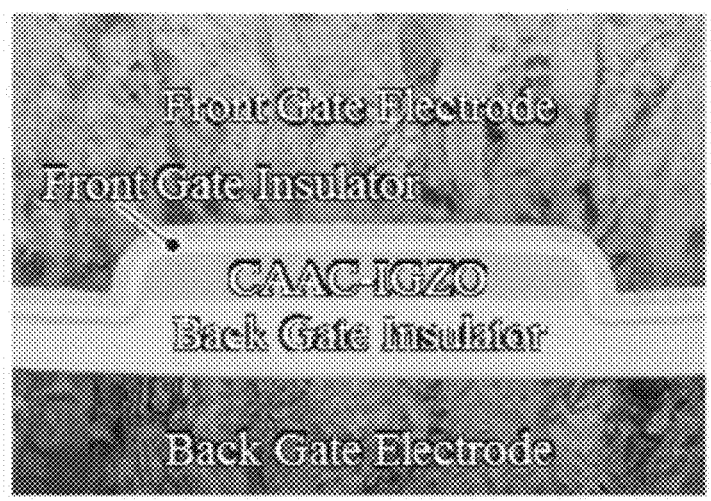

In this example, the relation between a potential applied to a back gate (denoted by "Back Gate Electrode" in FIGS. 17(A), 17(B), and the like) and the threshold voltage of an OS transistor that can be used for the memory cell 211 was investigated. Note that in this example, the potential applied to the back gate is denoted by $V_{BG}$, a potential applied to a front gate (denoted by "Front Gate Electrode" in FIGS. 17(A), 17(B), and the like) is denoted by $V_{FG}$, a current flowing between a source (denoted by "S/D Electrode" in FIG. 17(A)) and a drain (denoted by "S/D Electrode" in FIG. 17(A)) is denoted by $I_{ds}$, and a threshold voltage obtained by a $\sqrt{I_{ds}}$ extrapolation method is denoted by $V_{th}$.

It has been confirmed that the discussion in this example can also apply to threshold voltages having different definitions, e.g., a threshold voltage obtained by a constant current method.

FIGS. 17(A) and 17(B) show cross-sectional TEM (Transmission Electron Microscope) images of the manufactured OS transistor. FIG. 17(A) is a cross-sectional TEM image of the OS transistor in the channel length direction, and FIG. 17(B) is a cross-sectional TEM image of the OS transistor in the channel width direction. The OS transistor includes a back gate.

Figure 21:
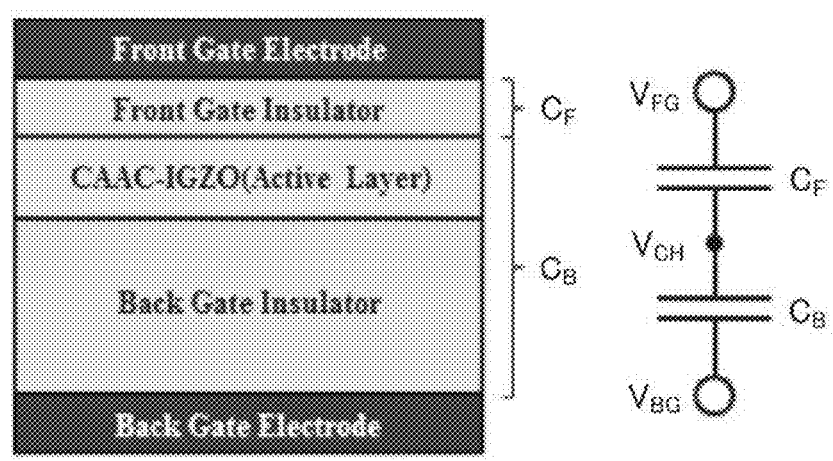
FIG. 21 A diagram illustrating a capacitance model.

As for the thickness of a back gate insulating film BGI (denoted by "Back Gate Insulator" in FIGS. 17(A) and 17(B) and FIG. 21), the EOT (Equivalent Oxide Thickness) was 30 nm; the thickness of an oxide where a channel formation region is formed (denoted by "CAAC-IGZO" in FIGS. 17(A) and 17(B) an denoted by "CAAC-IGZO (Active Layer) in FIG. 21" was 17 nm; and as for the thickness of a front gate insulating film FGI (denoted by "Front Gate Insulator" in FIGS. 17(A) and 17(B) and FIG. 21), three EOT conditions of 6.1 nm, 8.0 nm, and 11.2 nm were employed. The channel length is 0.37 um and the channel width is 0.24 um.

Figure 18A:
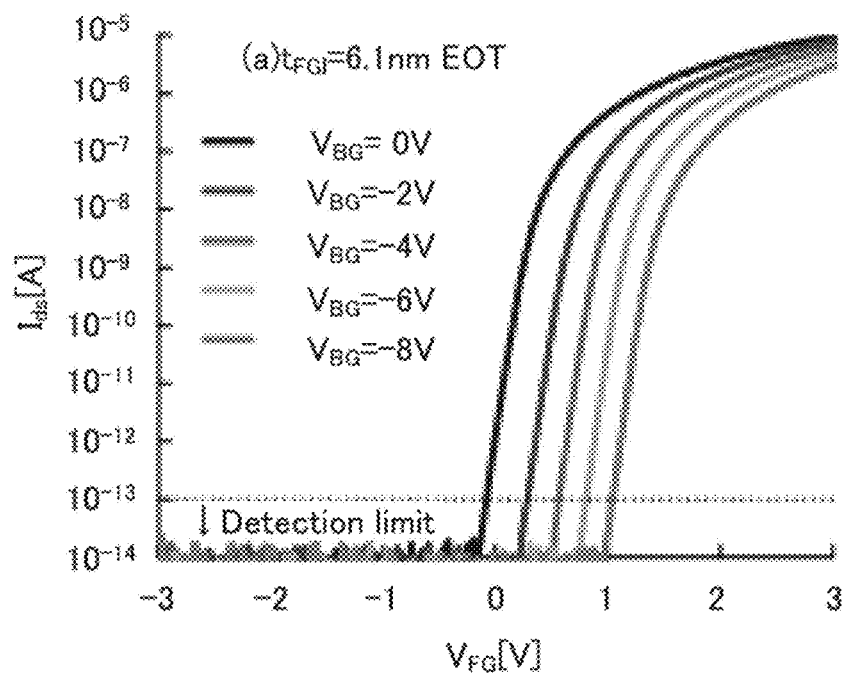
FIG. 18(A), (B) Graphs showing electrical characteristics of a transistor.

FIG. 18(A) shows a relation between the potential $V_{FG}$ applied to the front gate and the current $I_{ds}$ flowing between the source and the drain (hereinafter referred to as a $V_{FG}$-$I_{ds}$ curve) in the case where in the OS transistor having a thickness of the front gate insulating film FGI (denoted by "$t_{FGI}$" in the figure) of 6.1 nm, the potential $V_{BG}$ applied to the back gate was changed from 0 V to −8 V in increments of 2 V. When the potential $V_{BG}$ applied to the back gate is a negative potential, the $V_{FG}$-$I_{ds}$ curves shift in the positive direction.

Figure 18B:
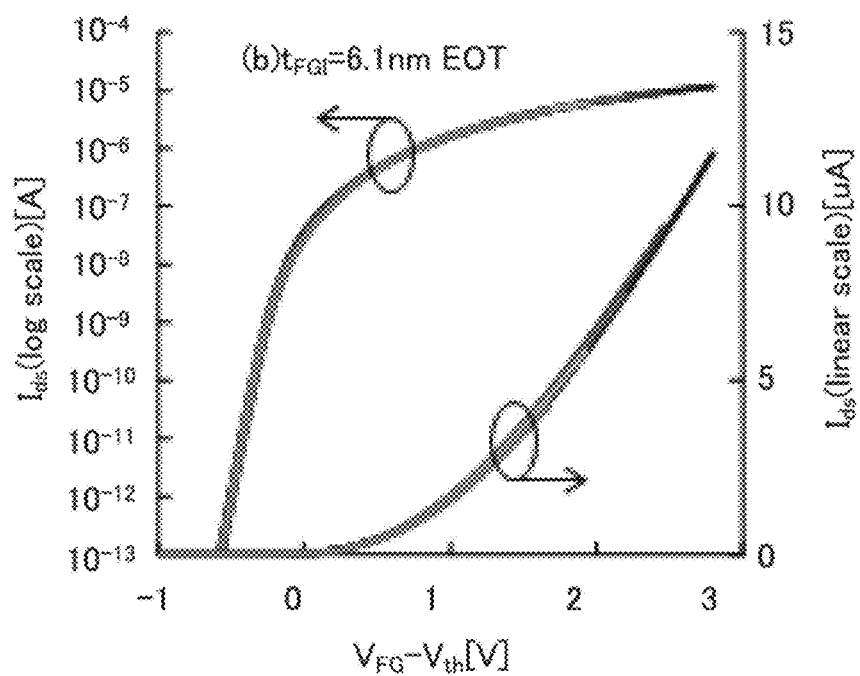

FIG. 18(B) shows the $V_{FG}$-$I_{ds}$ curves with the horizontal axis in the case where the threshold voltages $V_{th}$ are made equal to each other. It is found that even when the potential $V_{BG}$ applied to the back gate varies, the $V_{FG}$-$I_{ds}$ curves substantially overlap with each other and it is only the threshold voltage $V_{th}$ that changes depending on the potential $V_{BG}$ applied to the back gate.

Figure 19A:
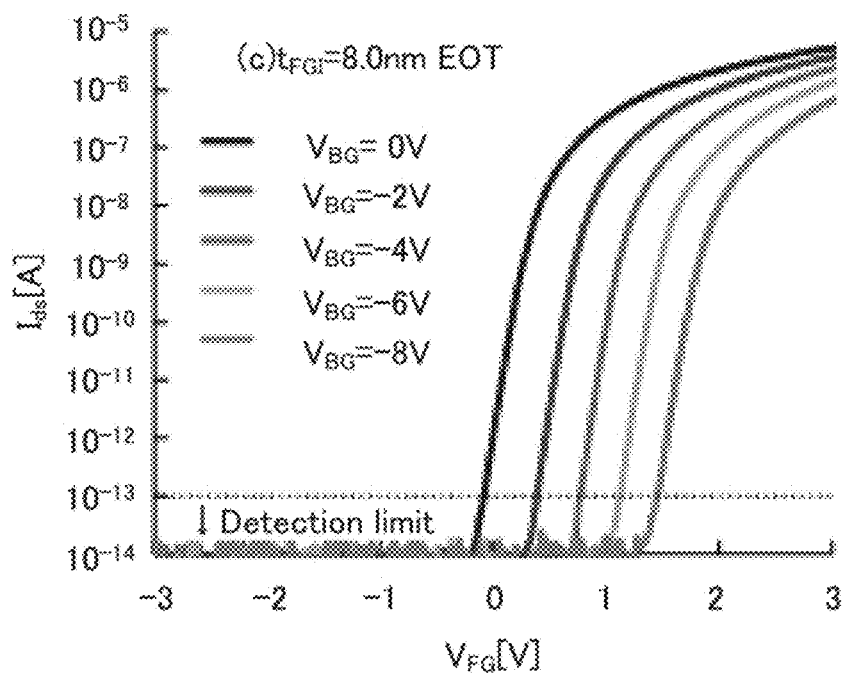
FIG. 19(A), (B) Graphs showing electrical characteristics of transistors.
Figure 19B:
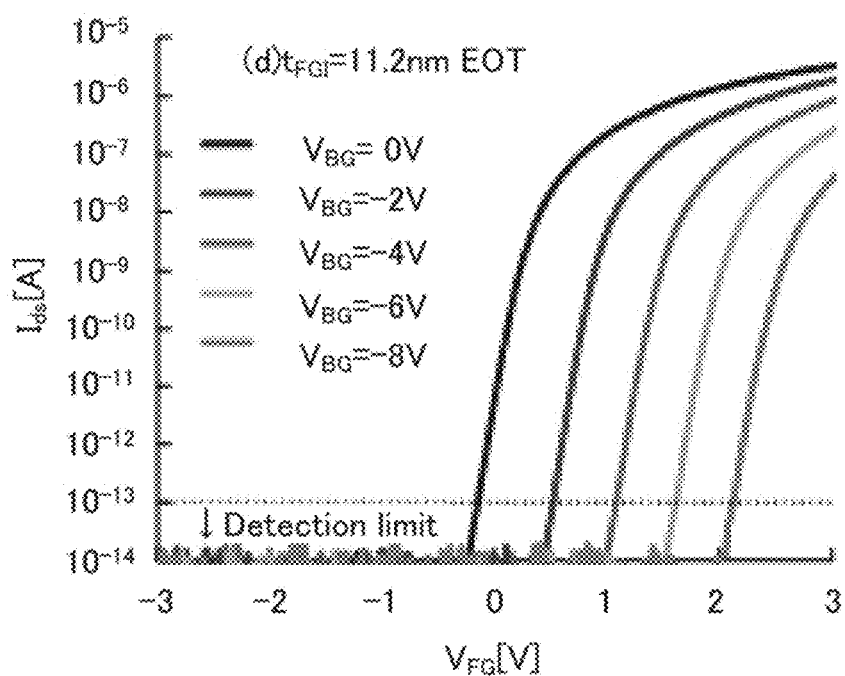

FIG. 19(A) shows $V_{FG}$-$I_{ds}$ curves in the case where the potential $V_{BG}$ applied to the back gate of the OS transistor having a thickness of the front gate insulating film FGI of 8.0 nm was changed from 0 V to −8 V in increments of 2 V. FIG. 19(B) shows $V_{FG}$-$I_{ds}$ curves in the case where the potential $V_{BG}$ applied to the back gate of the OS transistor having a thickness of the front gate insulating film FGI of 11.2 nm was changed from 0 V to −8 V in increments of 2 V.

According to FIG. 18(A) and FIG. 19(A), even when the potentials $V_{BG}$ applied to the back gates are the same, the $V_{FG}$-$I_{ds}$ curve shifts in the positive direction more in the OS transistor having a thickness of the front gate insulating film FGI (denoted by "$t_{FGI}$" in FIG. 18(A) and FIG. 19(A)) of 8.0 nm than in the OS transistor having a thickness of the front gate insulating film FGI of 6.1 nm.

According to FIG. 19(A) and FIG. 19(B), even when the potentials $V_{BG}$ applied to the back gates are the same, the $V_{FG}$-$I_{ds}$ curve shifts in the positive direction more in the OS transistor having a thickness of the front gate insulating film FGI of 11.2 nm than in the OS transistor having a thickness of the front gate insulating film FGI of 8.0 nm.

Figure 20A:
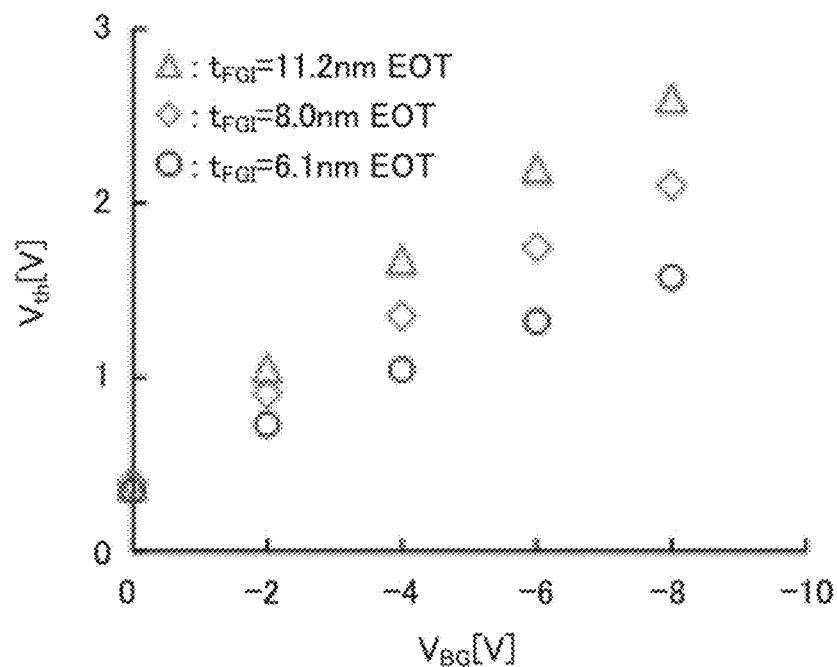
FIG. 20(A) A graph showing the threshold voltages of transistors, and (B) a graph showing the amount of change in the threshold voltages of the transistors and the subthreshold swings.

FIG. 20(A) shows a relation between the potentials $V_{BG}$ applied to the back gates of the OS transistors having thicknesses of the front gate insulating films FGI of 6.1 nm, 8.0 nm, and 11.2 nm and the threshold voltages $V_{th}$ extracted from the $V_{FG}$-$I_{ds}$ Curves. The relation between the potentials $V_{BG}$ applied to the back gates and the threshold voltages $V_{th}$ shown in FIG. 20(A) is the average of eight samples of OS transistors. It is found that as for each of the OS transistors having thicknesses of the front gate insulating films FGI of 6.1 nm, 8.0 nm, and 11.2 nm, the threshold voltage $V_{th}$ is changed substantially linearly with the potential $V_{BG}$ applied to the back gate.

Figure 20B:
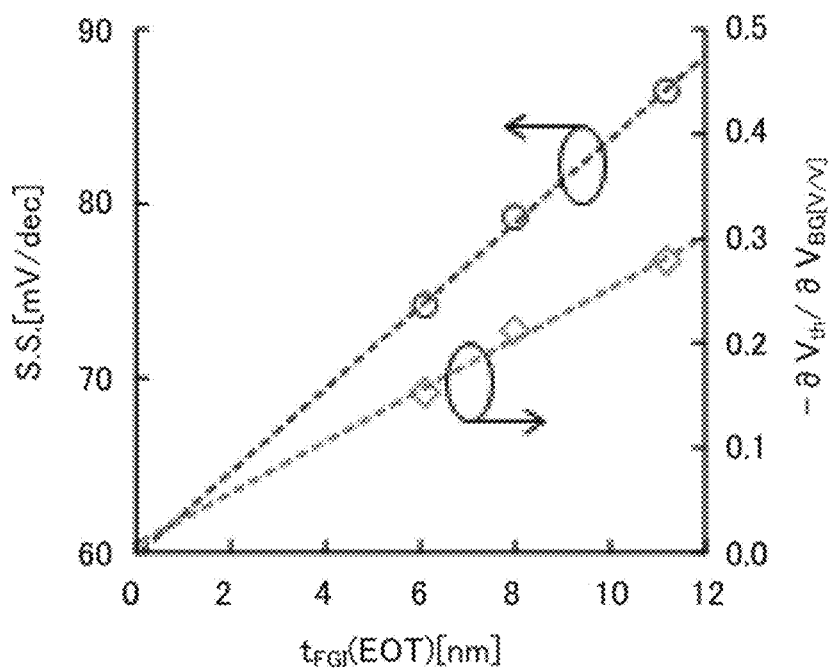

FIG. 20(B) shows a relation between the thickness of the front gate insulating film FGI and the amount of change in threshold voltage Vth with respect to the potential $V_{BG}$ applied to the back gate (hereinafter referred to as $\partial V_{th}/\partial V_{BG}$) and the subthreshold swing (S.S.).

The $\partial V_{th}/\partial V_{BG}$ is substantially linear with the thickness of the front gate insulating film FGI, and the intercept of the approximate curve is close to 0 V/V. The subthreshold swing is also substantially linear with the thickness of the front gate insulating film FGI, and the intercept of the approximate curve is close to 60 mV/dec.

Unlike in a Si transistor, the threshold voltage of an OS transistor is not controlled by addition of an impurity. In the OS transistor, in a region where the potential $V_{FG}$ applied to the front gate is lower than the threshold voltage $V_{th}$, the concentration of space charge in the channel formation region is low and thus, the space charge does not much affect band bending. Accordingly, in the region where the potential $V_{FG}$ applied to the front gate is lower than the threshold voltage $V_{th}$, the channel formation region of the OS transistor can be approximated to a simple capacitance model shown in FIG. 21.

Note that $V_{CH}$ represents an interface potential between the oxide where a channel formation region is formed and the front gate insulating film FGI; $C_F$, the capacitance on the front gate side above the interface between the oxide forming the channel formation region and the front gate insulating film FGI; and $C_B$, the capacitance on the back gate side below the interface between the oxide where a channel formation region is formed and the front gate insulating film FGI.

The amount of change in the interface potential $V_{cH}$ in the case where the potential $V_{FG}$ applied to the front gate or the potential $V_{BG}$ applied to the back gate is changed is obtained by the following formula (1) and formula (2).

[Formulae 1 and 2]

$$\frac{\partial V_{ch}}{\partial V_{FG}} = \frac{C_F}{C_F + C_B} \quad (1)$$

$$\frac{\partial V_{ch}}{\partial V_{BG}} = \frac{C_B}{C_F + C_B} \quad (2)$$

Assuming that the interface potential $V_{CH}$ at which the potential $V_{FG}$ applied to the front gate becomes equal to the threshold voltage $V_{th}$ is not changed regardless of the potential $V_{BG}$ applied to the back gate, the following formula (3) for $\partial V_{th}/\partial V_{BG}$ is established.

[Formula 3]

$$\frac{\partial V_{th}}{\partial V_{BG}} = -\frac{C_B}{C_F} \quad (3)$$

It can be understood from the formula (3) that the threshold voltage $V_{th}$ becomes a straight line having a slope of the ratio of the capacitance $C_B$ to the capacitance $C_F$, with respect to the potential $V_{BG}$ applied to the back gate.

Furthermore, on the basis of the same capacitance model, the subthreshold swing is expressed by the following formula (4).

[Formula 4]

$$S.S. = \ln(10)\frac{kT}{q}\left(1 + \frac{C_B}{C_F}\right) = \ln(10)\frac{kT}{q}\left(1 - \frac{\partial V_{th}}{\partial V_{BG}}\right) \quad (4)$$

From the formula (3) and the formula (4), both $\partial V_{th}/\partial V_{BG}$ and the subthreshold swing depend on the ratio of the capacitance $C_F$ to the capacitance $C_B$. In order to control the threshold voltage with the back gate in the OS transistor, the electrical characteristics of the OS transistor can be designed by the ratio of the capacitance $C_F$ to the capacitance $C_B$, in particular, the thickness of the front gate insulating film FGI and the thickness of the back gate insulating film BGI.

Figure 22A:
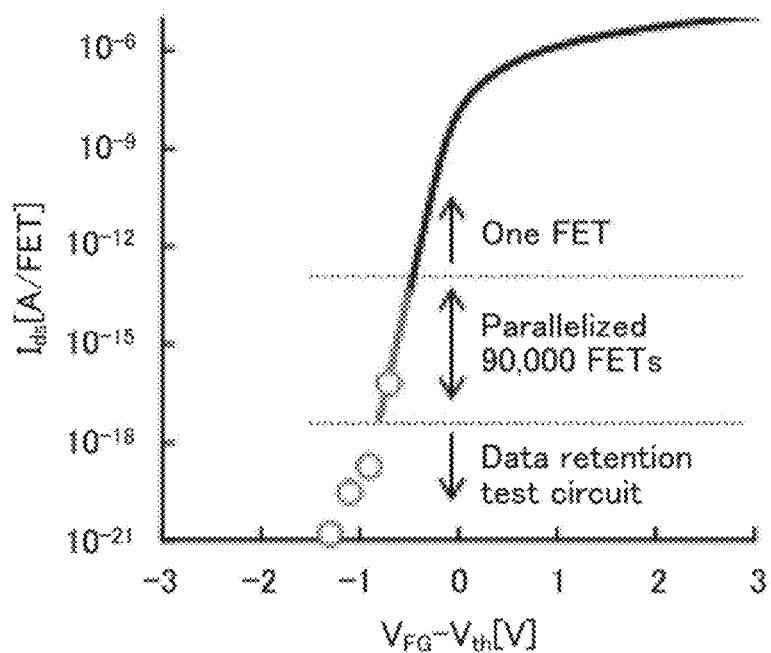
FIG. 22(A), (B) Graphs showing electrical characteristics of transistors.

Note that the electrical characteristics in the subthreshold region of the OS transistor cannot be sufficiently evaluated because the OS transistor has an extremely low off-state current, and measurement using one OS transistor (denoted by "One FET" in FIG. 22(A) does not allow adequate evaluation because of the detection limit of an evaluation apparatus (see FIG. 18(A), FIG. 19(A), and FIG. 19(B)). In view of this, by an evaluation method reported in Non-Patent Document 7 in which several tens of thousands to several hundreds of thousands of OS transistors are connected in parallel (90,000 OS transistors connected in parallel were evaluated and denoted by "Parallelized 90,000 FETs" in FIG. 22(A)), and a method using a data retention test circuit (denoted by "Data retention test circuit" in FIG. 22(A)), measurement was performed with high accuracy, and the results are shown as the $V_{FG}$–$I_{ds}$ curve (with the horizontal axis when the threshold voltages $V_{th}$ are made equal to each other) in FIG. 22(A).

It is found from FIG. 22(A) that the subthreshold region of the OS transistor extends to a region where the current $I_{ds}$ flowing between the source and the drain is extremely low. Thus, in a wide potential range in a region where the potential $V_{FG}$ applied to the front gate is lower than the threshold voltage $V_{th}$, the current $I_{ds}$ flowing between the source and the drain shows the subthreshold characteristics, that is, a behavior performed such that the current $I_{ds}$ flowing between the source and the drain is exponential to the potential $V_{FG}$ applied to the front gate.

In the subthreshold region of an n-channel transistor, as the value obtained by subtracting the threshold voltage $V_{th}$ from the potential $V_{FG}$ applied to the front gate is smaller, the current $I_{ds}$ flowing between the source and the drain becomes lower. Accordingly, shifting the threshold voltage $V_{th}$ in the positive direction (shifting the threshold voltage $V_{th}$ in the positive direction by applying a negative potential as the potential $V_{BG}$ applied to the back gate, which is denoted by "Positive shift by negative $V_{BG}$ in FIG. 22(B)") can reduce the current $I_{ds}$ flowing between the source and the drain (denoted by "Significantly decrease" in FIG. 22(B)).

Figure 22B:
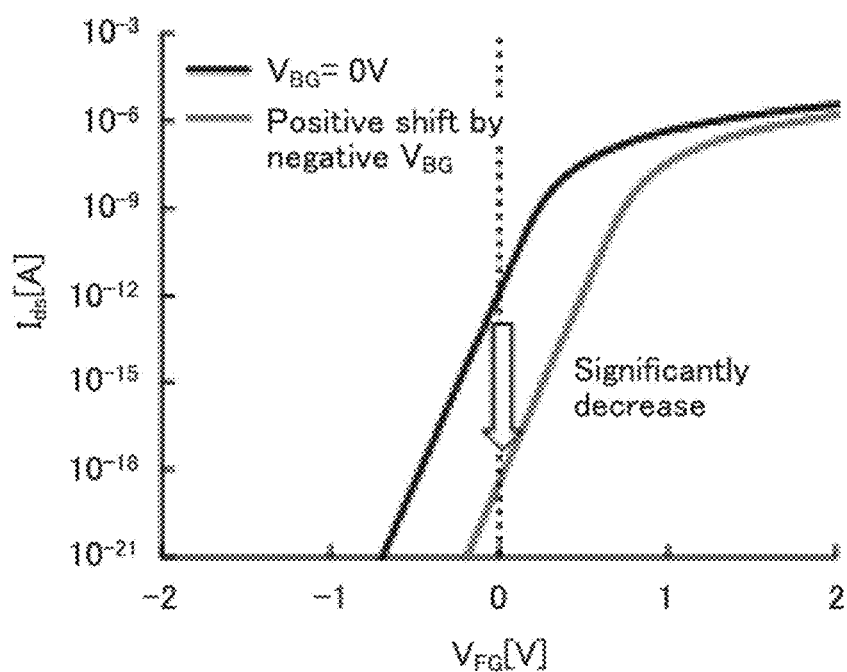

The subthreshold region of the OS transistor extends to a region where the current $I_{ds}$ flowing between the source and the drain is extremely low, and thus as shown in FIG. 22(B), changing the threshold voltage $V_{th}$ by the potential $V_{BG}$ applied to the back gate can significantly change the current $I_{ds}$ flowing between the source and the drain in the subthreshold region.

As described above, in the OS transistor, a variety of electrical characteristics appropriate for an intended purpose can be achieved by controlling the threshold voltage $V_{th}$ with the potential $V_{BG}$ applied to the back gate.

At least part of the structure, the method, and the like described in this example can be implemented in appropriate combination with other embodiments described in this specification.

REFERENCE NUMERALS

CA: capacitor, CB: capacitor, CC: capacitor, M11: transistor, M12: transistor, M13, transistor, M14: transistor, M15: transistor, M16: transistor, SUB: semiconductor substrate, 50: conductive layer, 60: conductive layer, 70: conductive layer, 100: memory, 101: layer, 110: peripheral circuit, 121: row decoder, 122: word line driver circuit, 130: bit line driver circuit, 131: column decoder, 132: precharge circuit, 133: sense amplifier, 134: circuit, 140: output circuit, 150: control logic circuit, 160: VBG control circuit, 201: layer, 210: memory cell array, 211: memory cell, 212: memory cell, 213: memory cell, 214: memory cell, 220: memory cell array, 230: memory cell array, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 501: transistor, 503: conductor, 510A: transistor, 510B: transistor, 510C: transistor, 510D: transistor, 510E: transistor, 511: insulator, 512: insulator, 514: insulator, 515: insulator, 516: insulator, 518: conductor, 521: insulator, 522: insulator, 524: insulator, 530: oxide, 530a: oxide, 530b:

oxide, 530c: oxide, 531: region, 531a: region, 531b: region, 541: insulator, 542: conductor, 542a: conductor, 542b: conductor, 543: region, 543a: region, 543b: region, 544: insulator, 545: insulator, 546: conductor, 546a: conductor, 546b: conductor, 547: conductor, 547a: conductor, 547b: conductor, 548: conductor, 550: insulator, 551: oxide, 552: metal oxide, 560: conductor, 560a: conductor, 560b: conductor, 570: insulator, 571: insulator, 574: insulator, 575: insulator, 576: insulator, 576a: insulator, 576b: insulator, 580: insulator, 581: insulator, 582: insulator, 586: insulator, 587: insulator, 600: capacitor, 610: conductor, 612: conductor, 620: conductor, 630: insulator, 650: insulator, 5200: portable game machine, 5201: housing, 5202: display portion, 5203: button, 5300: keyboard, 5500: information terminal, 5510: housing, 5511: display portion, 5700: automobile, 5701: display panel, 5702: display panel, 5703: display panel, 5704: display panel, 5800: electric refrigerator-freezer, 5801: housing, 5802: a refrigerator door, 5803: a freezer door.

The invention claimed is:

1. A storage device comprising:
   a first circuit;
   first and second electrodes over the first circuit; and
   a second circuit comprising a first memory cell array and a second memory cell array,
   wherein each of the first and second memory cell arrays comprises a plurality of memory cells,
   wherein each of the plurality of memory cells comprises a first transistor and a capacitor,
   wherein the first transistor comprises a gate and a back gate,
   wherein the first memory cell array comprises a region overlapping with the first circuit with the first electrode therebetween,
   wherein the second memory cell array comprises a region overlapping with the first circuit with the second electrode therebetween,
   wherein the first electrode functions as the back gates of the first transistors included in the first memory cell array,
   wherein the second electrode functions as the back gates of the first transistors included in the second memory cell array, and
   wherein each of the first electrode and the second electrode has any one of a striped pattern, a matrix pattern, and a mesh pattern.

2. The storage device according to claim 1, wherein a potential applied to the first electrode is different from a potential applied to the second electrode.

3. The storage device according to claim 1, wherein the first transistor comprises a metal oxide in a channel formation region.

4. The storage device according to claim 1, wherein the first circuit comprises a transistor comprising silicon in a channel formation region.

5. The storage device according to claim 1, wherein each of the first electrode and the second electrode has an opening.

6. The storage device according to claim 1, wherein each of the first electrode and the second electrode has an opening, and
   wherein the opening does not overlap with the first transistor.

7. The storage device according to claim 1, wherein each of the plurality of memory cells further comprises a second transistor, and
   wherein one of a source and a drain of the first transistor is electrically connected to one electrode of the capacitor and a gate of the second transistor.

8. The storage device according to claim 1, wherein each of the plurality of memory cells further comprises a second transistor and a third transistor,
   wherein one of a source and a drain of the first transistor is electrically connected to one electrode of the capacitor and a gate of the second transistor, and
   wherein one of a source and a drain of the second transistor is electrically connected to one of a source and a drain of the third transistor.

\* \* \* \* \*